(12) United States Patent
Pfefferlein

(10) Patent No.: US 11,153,977 B2
(45) Date of Patent: Oct. 19, 2021

(54) CIRCUIT CARRIER, PACKAGE, AND METHOD FOR MANUFACTURING A PACKAGE

(71) Applicant: Siemens Aktiengesellschaft, Munich (DE)

(72) Inventor: Stefan Pfefferlein, Heroldsberg (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 17/033,127

(22) Filed: Sep. 25, 2020

(65) Prior Publication Data
US 2021/0100110 A1  Apr. 1, 2021

(30) Foreign Application Priority Data
Sep. 27, 2019  (EP) .................................... 19200008

(51) Int. Cl.
| | |
|---|---|
| H05K 1/11 | (2006.01) |
| H05K 1/16 | (2006.01) |
| H05K 1/18 | (2006.01) |
| H05K 3/00 | (2006.01) |
| H05K 3/30 | (2006.01) |
| H05K 5/06 | (2006.01) |
| H01L 21/00 | (2006.01) |
| H01L 21/48 | (2006.01) |

(Continued)

(52) U.S. Cl.
CPC ......... *H05K 3/4697* (2013.01); *H05K 3/4007* (2013.01); *H05K 3/4038* (2013.01)

(58) Field of Classification Search
CPC ... H05K 1/11; H05K 1/16; H05K 1/18; H05K 3/00; H05K 3/30; H05K 5/06

USPC .......... 361/760, 761; 174/250, 261; 257/98, 257/668, 700, 702, 729, 773
See application file for complete search history.

(56) References Cited

U.S. PATENT DOCUMENTS 5,841,194 A * 11/1998 Tsukamoto ............. H01L 24/32
257/729
9,512,990 B2 * 12/2016 Wakaki ................ G02B 6/0073
(Continued)

FOREIGN PATENT DOCUMENTS

| EP | 2 187 717 A1 | 5/2010 |
|---|---|---|
| JP | 2003347460 A | 12/2003 |

(Continued)

OTHER PUBLICATIONS

Dielectrics for embedding active and passive components; J.Kress et al., Atotech Deutschland GmbH, Basle, Switzerland.
(Continued)

*Primary Examiner* — Xiaoliang Chen
(74) *Attorney, Agent, or Firm* — Henry M. Feiereisen LLC

(57) ABSTRACT

A circuit carrier includes a first side, two layers arranged to define an intermediate space there between, with at least one of the two layers being electrically conductive and attached to the first side. The at least one of the two layers has a region deformed such as to exhibit an indentation and has a trace structure in the indentation. A first insulating material fills the intermediate space, and a second insulating material fills the indentation, A second side in opposition to the first side is shaped to have in the deformed region a cut-out for receiving a bare die such as to come into an electrical contact with the at least one of the two layers.

12 Claims, 13 Drawing Sheets

(51) Int. Cl.
*H01L 21/50* (2006.01)
*H01L 21/56* (2006.01)
*H01L 23/00* (2006.01)
*H01L 23/28* (2006.01)
*H01L 23/31* (2006.01)
*H01L 23/498* (2006.01)
*H01L 23/552* (2006.01)
*H05K 3/46* (2006.01)
*H05K 3/40* (2006.01)

(56) References Cited

U.S. PATENT DOCUMENTS

| | | | | |
|---|---|---|---|---|
| 10,163,798 | B1* | 12/2018 | Alur | H01L 23/49816 |
| 2005/0006136 | A1* | 1/2005 | Arnold | H05K 1/16 |
| | | | | 174/250 |
| 2007/0177380 | A1 | 8/2007 | Schultz et al. | |
| 2008/0186690 | A1* | 8/2008 | Miettinen | H01L 24/24 |
| | | | | 361/761 |
| 2009/0072381 | A1* | 3/2009 | Ishihara | H01L 23/49838 |
| | | | | 257/700 |
| 2010/0147573 | A1 | 6/2010 | Fukuda | |
| 2013/0213704 | A1* | 8/2013 | Lu | H01L 23/49534 |
| | | | | 174/261 |
| 2014/0327024 | A1* | 11/2014 | Ishihara | H05K 1/056 |
| | | | | 257/98 |
| 2014/0353836 | A1* | 12/2014 | O'Sullivan | H01L 21/561 |
| | | | | 257/773 |
| 2015/0262841 | A1 | 9/2015 | Kim et al. | |
| 2017/0133340 | A1* | 5/2017 | Azdasht | H01L 23/49562 |
| 2018/0090449 | A1* | 3/2018 | Jeong | H01L 23/552 |

FOREIGN PATENT DOCUMENTS

| | | |
|---|---|---|
| JP | 2005285841 A | 10/2005 |
| JP | 2006324617 A | 11/2006 |
| JP | 2007042893 A | 2/2007 |
| JP | 2016143782 A | 8/2016 |
| JP | 2017063094 A | 3/2017 |

OTHER PUBLICATIONS

Embedding of Chips for System in Package realization—Technoiogy and Applications; L.Boettcher et al.; Fraunhofer Institue for Reliability and Microintegration (IZM), Technical University of Berlin, Gustav-Meyer-Allee 25, 13355 Berlin.

* cited by examiner

CIRCUIT CARRIER, PACKAGE, AND METHOD FOR MANUFACTURING A PACKAGE

CROSS-REFERENCES TO RELATED APPLICATIONS

This application claims the priority of European Patent Application, Serial No. 19200008.1, filed Sep. 27, 2019, pursuant to 35 U.S.C. 119(a)-(d), the disclosure of which is incorporated herein by reference in its entirety as if fully set forth herein.

BACKGROUND OF THE INVENTION

The present invention relates to a circuit carrier, package, and method for manufacturing a package.

The following discussion of related art is provided to assist the reader in understanding the advantages of the invention, and is not to be construed as an admission that this related art is prior art to this invention.

In an academic paper by Boettcher, L.; Manessis, D.; Ostmann, A.; Karaszkiewicz, S.; Reichl, H. Embedding of Chips for System in Package realization—Technology and Applications, 2008 3rd International Microsystems, Packaging, Assembly & Circuits Technology Conference (2008), pages 383 to 386. ISSN 2150-5934, a circuit carrier is disclosed with a semiconductor die embedded therein. The semiconductor die—the electronic component—has more than one terminal on one of its sides. In this context, the terminals on this component side can usually only be in contact by way of laser-drilled through-connections (vias).

Generation of such vias has many disadvantages. Firstly, cavities known in the field as void clusters occur as a result of soldering in the region of the vies, Secondly, vies restrict the current-carrying capacity, as the switching current is generally guided through the vies—at least in transistors. Thirdly, heat dissipation of the bare die can only take place poorly on the side with the laser-drilled vies, as the vies restrict an effective thermal coupling to the traces, meaning that a sufficient electrical coupling, but only a poor thermal coupling can be achieved at the copper layer or the component terminal. In this case, the heat dissipation may for the most part only take place by way of the rear side of the component. Prior art approaches enabling heat dissipation on both sides require two circuit carriers or control structures or lead frames, between which the component can be introduced and be in contact over a large area. These approaches are technically complex, however. Fourthly, the leakage inductance is influenced by vias. Fifthly, blind via laser drilling on chip pads is a highly time-intensive process step which is susceptible to errors.

It would therefore be desirable and advantageous to address these problem and to obviate other prior art shortcomings.

SUMMARY OF THE INVENTION

According to one aspect of the present invention, a circuit carrier includes a first side, two layers arranged to define an intermediate space there between, at least one of the two layers being electrically conductive and attached to the first side, the at least one of the two layers having a region deformed such as to exhibit an indentation, the at least one of the two layers having a trace structure in the indentation, a first insulating material filling the intermediate space, a second insulating material filling the indentation, and a second side in opposition to the first side and having in the deformed region a cut-out for receiving a bare die such as to come into an electrical contact with the at least one of the two layers.

To ensure clarity, it is necessary to establish the definition of several important terms and expressions that will be used throughout this disclosure.

The term "first insulating material" involves an insulating material in a raw state. This may involve a sheet material, for example, which may be more or less dimensionally stable. It may be present in the form of a paste, for example, viscous, or ductile, as long as it remains on the at least one electrically conductive layer at the point where it has been applied and does not run.

The term "bare die" is understood to relate to an unenclosed electronic component, e.g. a power semiconductor switch, a chip or a "naked" chip.

The invention is based on the understanding that, in a circuit carrier, it is possible to dispense with vias when the circuit carrier has an indentation, preferably with a trace structure, on a first side to which an at least electrically conductive layer is attached, and has a cut-out for receiving an electronic component and for bringing it into contact with the trace structure on a second side which lies opposite the first side, specifically in the region lying opposite the indentation, A cut-out for receiving an electronic component means a cut-out which has an appropriate shape and size for the electronic component.

Furthermore, the invention is based on the understanding that in order to manufacture a circuit carrier according to the present invention, the deformed region is embodied with an indentation by way of a reshaping process of a board (using a semi-finished part made of the first insulating material), for example during lamination of the board, and a cut-out for receiving an electronic component is generated on the side of the board opposite the indentation, wherein, as will be described in more detail further below, a temporal sequence of the generation of the cut-out and of the reshaping process can be changed.

Moreover, the invention is based on the understanding that, on the basis of a same board and an electronic component to be populated, a package can be created in which it is possible to eliminate the need for via holes for example, when for example the electronic component is populated in the cut-out before the curing and deforming and is preferably brought into contact with the at least electrically conductive board.

Advantageously, the trace structure may be formed in the base of the indentation. This makes it possible to use simple and precise etching methods. A laser direct structuring of the traces is also conceivable.

With regard to material savings and in order for the contacting structures of the circuit carrier—towards the outside—to be able to remain raised above the second insulating material, it may be expedient if exclusively the indentation is filled in with the second insulating material, i.e. the indentation is at most only filled up to its edges and there is no second insulating material which exists outside the indentation on the first side.

According to another advantageous feature of the present invention, the other one of the two layers can be made of a thermally conductive material. It is conceivable for the other one of the two layers to be embodied from a same material as the core of the circuit carrier, i.e. from the first insulating material.

According to another advantageous feature of the present invention, the other one of the two layers can be made of an electrically conductive material. As a result, the circuit carrier can be contacted on both sides.

Provision may advantageously be made for both layers to be made of a same material, advantageously of metal, preferably copper. This makes it possible to generate a two-layer or double-sided circuit carrier. Circuit carriers of this kind may for example form a basis for multi-layer structures (also referred to as multilayers) as an inner layer.

Manufacturing of the circuit carrier may be simplified when the second side of the circuit carrier opposite the first side has an elevation in the deformed region and the cut-out is formed in the elevation.

According to another advantageous feature of the present invention, the first insulating material can be a thermally deformable plastic, advantageously a prepreg material, for example a glass-fiber reinforced prepreg material, e.g. glass-fiber reinforced laminate. Thermally deformable materials which have a thermoplastic preliminary stage may be particularly suitable for the manufacturing of the circuit carrier.

According to another advantageous feature of the present invention, the second insulating material can be a resin or a prepreg material. The second insulating material may be a thermosetting plastic for example, preferably phenolic resin or epoxy. The second insulating material may be a chemically curing material with a liquid preliminary stage for example.

According to another advantageous feature of the present invention, the base of the cut-out can be at least partially formed by the layer made of the at least electrically conductive material attached to the first side of the circuit carrier. Advantageously, the trace structure is formed in the base of the indentation.

Moreover, it may be advantageous, when the cut-out is open on the side through which the bare die can be populated, and remains open after populating.

It will be understood by persons skilled in the art that the circuit carrier may have a plurality of cut-outs embodied as mentioned above. In this context, at least one electronic component may be populated in each cut-out. It is possible to populate different kinds of electronic components in different cut-outs, such as lateral or transverse components for example.

According to another aspect of the present invention, a method for manufacturing a circuit carrier includes arranging an electrically conductive first layer on a first side of a board at a distance to a second layer to define an intermediate space there between, filling the intermediate space with a first insulating material, curing the board such as to deform a region of the board in such a way that the electrically conductive first layer has an indentation in the deformed region, forming a cut-out on a second side of the board in opposition to the first side such that the indentation and the cut-out lie opposite one another, structuring the electrically conductive first layer to produce a trace structure, populating a bare die in the cut-out such as to come into electrical contact with the electrically conductive first layer, and filling the indentation with a second insulating material.

According to another advantageous feature of the present invention, the trace structure can be produced in the indentation.

Advantageously, the indentation can be filled with a second insulating material up to its edge.

It will be understood by persons skilled in the art that the order of the method steps "curing/deforming", i.e. obtaining a stable compound structure, "forming" and "structuring" may be different. Regardless of the order, the board can be assumed to be a board in which the first insulating material has not yet cured (semi-finished part), i.e. the board is in a "raw state".

Each of the orders can have its own advantages. Depending on which material is used as the first insulating material, one order of the steps or the other may prove advantageous. when, for example, a glass-fiber reinforced prepreg material is used as the first insulating material, it may be expedient to first form the cut-outs and then to deform and cure the board, for example to laminate it, because the glass-fiber reinforced prepreg material is mechanically stable/dimensionally stable enough for the shaped cut-outs to be retained after the curing and deforming—i.e. in the stable compound structure. In the case of other materials, e.g. the prepregs, which do not contain stabilizing woven glass fibers, but rather only made of resins with other filling materials, it may be expedient to first deform and cure the board, in order to produce a stable compound structure, and then to form the corresponding cut-outs. Regardless, the at least electrically conductive layer may already come before the "curing/deforming" and "forming".

In a mass manufacturing process, it may be provided that the structuring takes place by means of etching due to cost reasons. It is also conceivable, however, for the structuring to take place by means of a laser and, in doing so, using laser direct structuring in particular.

Moreover, it may be provided that the deforming takes place during the lamination, i.e. the board is laminated in such a way that in doing so the aforementioned deformed region is formed. The lamination is understood to mean the lamination using pressure and temperature—a standard process in printed circuit board manufacturing.

Further advantages are produced when the generating of the cut-out takes place by way of deep milling or punching out, wherein the milling or punching out preferably takes place up to the at least electrically conductive layer arranged on the first side of the circuit carrier.

According to still another aspect of the present invention, a package includes a circuit carrier including a first side, two layers arranged to define an intermediate space there between, at least one of the two layers being electrically conductive and attached to the first side, the at least one of the two layers having a region deformed such as to exhibit an indentation, the at least one of the two layers having a trace structure in the indentation, a first insulating material filling the intermediate space, a second insulating material filling the indentation, and a second side in opposition to the first side and having in the deformed region a cut-out, and a bare die populated in the cut-out such as to come into an electrical contact with the at least one of the two layers.

According to another advantageous feature of the present invention, provision may be made for a third insulating material to at least partially fill the cut-out (with the bare die situated therein) The third insulating material may for example possess approximately the same properties as the second insulating material—it may be chemically curable and/or have a liquid preliminary stage for example.

Furthermore, the third insulating material may also be made of constituent parts of the first insulating material. This may happen when the bare die is first populated and contacted in the cut-out and then the populated board is cured and deformed, e.g. laminated, in order to obtain a stable compound structure. This procedure is explained in greater detail in connection with the package manufacturing method. It may be expedient if the bare die has a plurality of electrical terminals (chip bond pads), wherein the electrical terminals are in contact with the trace structure.

Advantageously, provision may be made for the bare die to be embodied as a lateral component, for example as a GaN component or a vertical or transverse component, for example as an IGBT component.

According to another advantageous feature of the present invention, provision may be made for an additional circuit carrier attached to the bare die at a side which faces away from the first side of the circuit carrier, i.e. to the rear side. This enhances thermal heat dissipation of the bare die or of the package. As an alternative, provision may be made for a cover to be attached to the package as a heat spreader.

Advantageously, the additional circuit carrier can be configured to dissipate heat from the bare die and to electrically insulate it.

When the second layer is also electrically conductive, it is advantageous when the additional circuit carrier is electrically connected to the second layer, for example by means of a pad or bump or the like. In this case, the bare the may be electrically contacted by the additional circuit carrier.

Advantageously, the package can be embodied as a surface-mounted component.

According to still another aspect of the present invention, a method for manufacturing a package includes arranging an electrically conductive first layer on a first side of a board at a distance to a second layer to define an intermediate space there between, filling the intermediate space with a first insulating material, curing the board such as to deform a region of the board in such a way that the electrically conductive first layer has an indentation in the deformed region, forming a cut-out on a second side of the board in opposition to the first side such that the indentation and the cut-out lie opposite one another, populating a bare die in the cut-out such as to come into electrical contact with the electrically conductive first layer, structuring the electrically conductive first layer to produce a trace structure which is preferably arranged at least in the indentation and in particular in electrical contact with the bare die, and filling the indentation with a second insulating material.

It will again be understood by persons skilled in the art that it is, of course, possible to change the order of the steps in the package manufacturing method described above in a corresponding manner.

For example, provision may be made to first form the cut-out in the board, advantageously through punching out; the bare die is then populated in the cut-out, in order to obtain a populated board, and then the populated board is cured and deformed in the process, advantageously by lamination, in order to obtain the at least one deformed region, in which the at least electrically conductive layer has the indentation at the point which lies opposite the indentation. In this context, it may be expedient when, during the deforming, the bare die is insulated with the first insulating material—in this case the aforementioned third insulating material made of constituent parts of the first insulating material. In the aforementioned sequence of steps, the populated (and contacted) bare die is also "moved" simultaneously in the Z direction, i.e. transversely to the board, when generating the cavity or the indentation, wherein in this context constituent parts from the first insulating material flow into the intermediate spaces between the cut-out and the bare die contour or the cut-out contour adapts to the bare die outline contour using temperature and pressure.

Such an order of method steps may be advantageous, for example, when the prepreg material, which is used as the first insulating material, is glass-fiber reinforced, e.g. is a laminate made of not-yet crosslinked resin and glass fibers. A board with such a prepreg material is flexible in the "raw state" and—depending on the type—can already be processed in this state in order to carve out the cut-outs or windows for example. When the board is now laminated (using pressure and temperature) (standard printed circuit board process), then the resin begins to flow, adheres to the layer(s) and cures. This produces a stable compound structure. During this phase, a shaping may also take place (deforming of the at least one region), in order to obtain a cavity or indentation. As a result of the prepreg material being glass-fiber reinforced, the previously shaped, preferably punched-out cut-outs are retained after the deforming and curing.

According to another advantageous feature of the present invention, it may be advantageous when first the provided board is cured, and deformed in the process, advantageously by lamination, in order to obtain the at least one deformed region, in which the at least electrically conductive layer has the indentation. In this context, a board with the at least one deformed region is generated as a stable compound structure. After this, the cut-out is formed, advantageously deep-milled, on the second side of the board opposite the first side, at a point which lies opposite the indentation. Subsequently, the bare die is populated in the cut-out, so that the bare die is in electrical contact with the at least electrically conductive layer. This order may then primarily prove expedient if the prepreg material used at the first insulating material does not contain stabilizing woven glass fibers, but rather is only made of resins with other filling materials. It is then very difficult for processing to take place in the raw state here due to the lack of dimensional stability. In this case, the introduction of the cut-out, advantageously by means of rear-side deep milling, in particular until reaching the at least electrically conductive layer, only becomes easier after the curing—i.e. after obtaining a compound structure.

According to another advantageous feature of the present invention, the cut-out may at least partially be filled with a third insulating material. This may then be advantageous when the cut-out is only formed after the curing and deforming of the board.

According to yet another aspect of the present invention, a converter includes a circuit carrier as set forth above and/or a package as set forth above.

BRIEF DESCRIPTION OF THE DRAWING

Other features and advantages of the present invention will be more readily apparent upon reading the following description of currently preferred exemplified embodiments of the invention with reference to the accompanying drawing, in which.

DETAILED DESCRIPTION OF PREFERRED EMBODIMENTS

Figure 1:
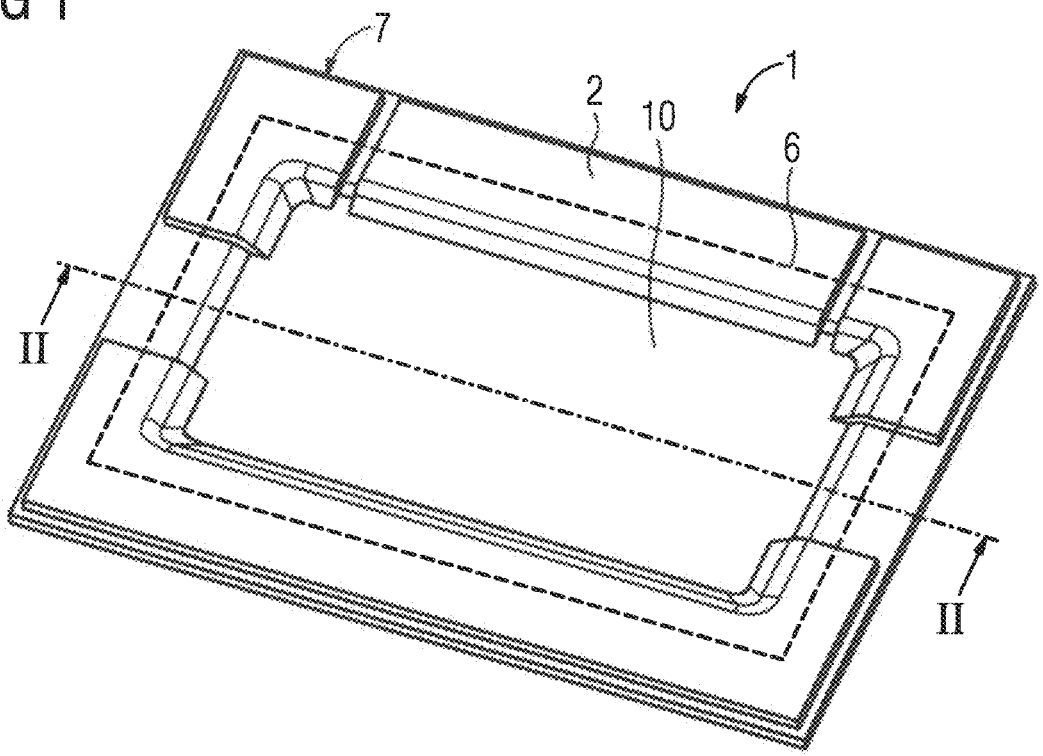
FIG. 1 shows a top perspective view of one embodiment of a circuit carrier according to the present invention.

Throughout all the figures, same or corresponding elements may generally be indicated by same reference numerals. These depicted embodiments are to be understood as illustrative of the invention and not as limiting in any way.

It should also be understood that the figures are not necessarily to scale and that the embodiments may be illustrated by graphic symbols, phantom lines, diagrammatic representations and fragmentary views. In certain instances, details which are not necessary for an understanding of the present invention or which render other details difficult to perceive may have been omitted.

Figure 4:
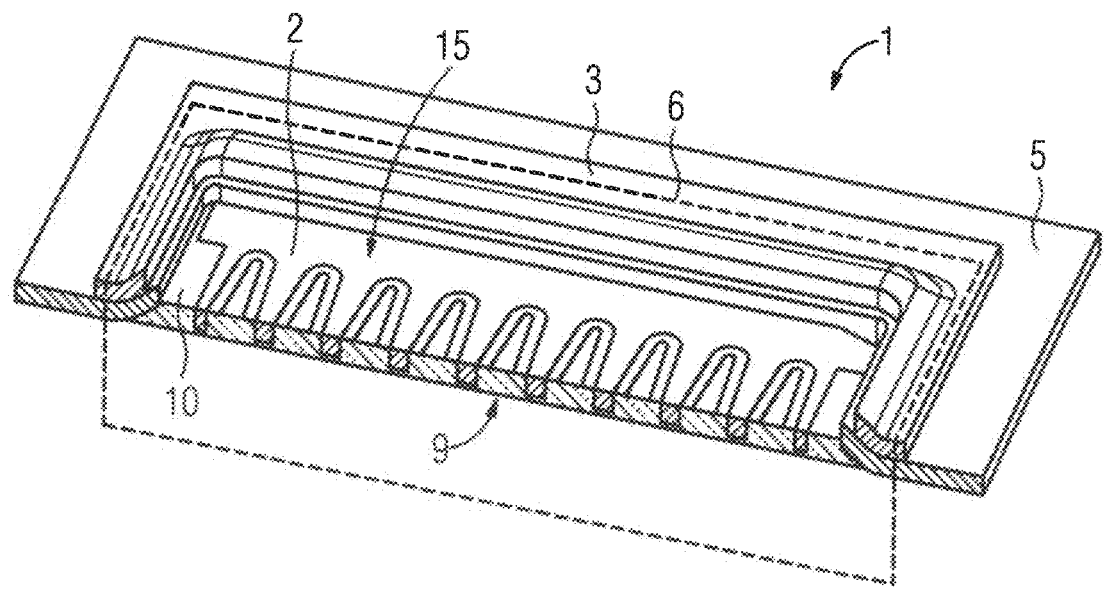
FIG. 4 shows a sectional representation of the circuit carder of FIG. 3.
Figure 5:
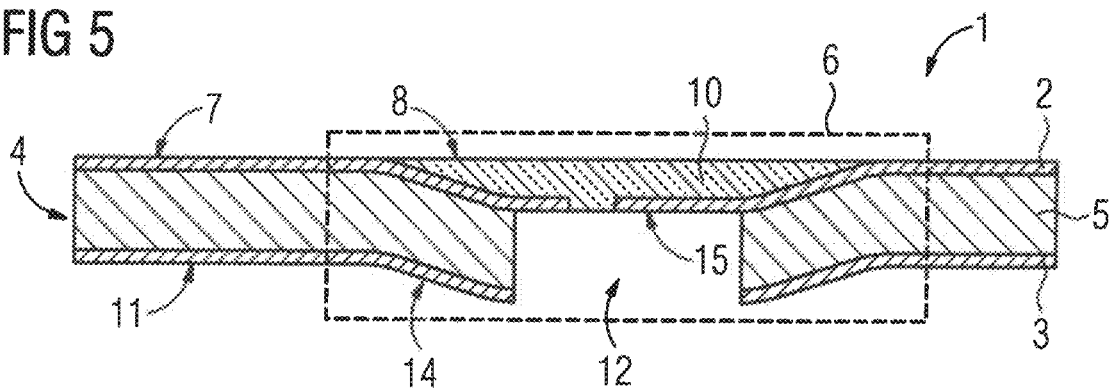
FIG. 5 shows a cross-sectional view of the circuit carder of FIG. 3.
Figure 6:
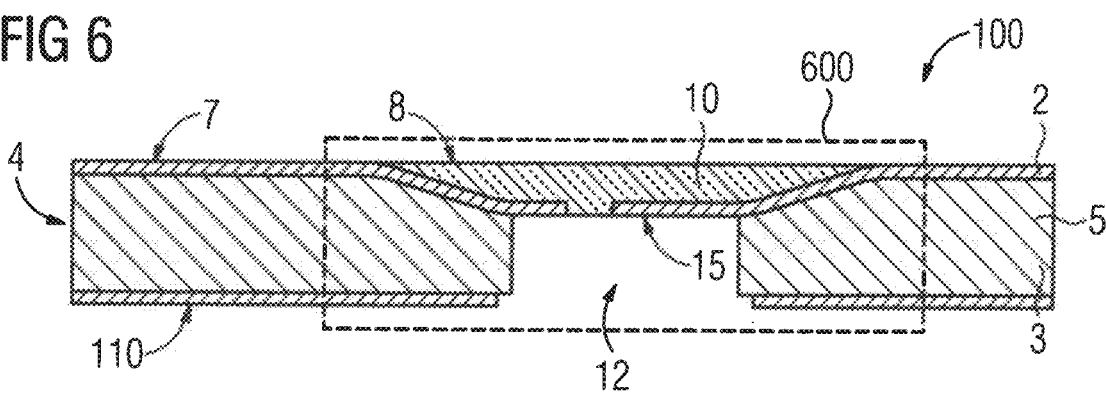
FIG. 6 shows a cross-sectional view of another embodiment of a circuit carder according to the present invention.

Turning now to the drawing, and in particular to FIGS. 1 to 6, with FIGS. 1 to 5 showing various views of a first embodiment of a circuit carrier according to the present invention, generally designated by reference numeral 1, and with FIG. 6 showing a cross-sectional view of a second embodiment of a circuit carrier according to the present invention, generally designated by reference numeral 100. The description below relates to both embodiments of the circuit carrier. Specific reference is made to the differences between the embodiments. The circuit carrier 1, 100 has two layers 2, 3, wherein at least one of the two layers 2 of the circuit carrier 1, 100 is made of an at least electrically conductive material. This material is preferably copper. It is likewise conceivable to use other electrically conductive materials, e.g. metals, such as aluminum, or alloys. The at least electrically conductive layer 2 is attached to a first side 7 of the circuit carrier 1, 100.

An intermediate space 4 is defined between the layers 2, 3. In this context, the second layer 3 may also be made of a dielectric, e.g. be embodied from the first insulating material. Advantageously, however, at least electrically conductive layers 2 and 3, for example copper layers, are used.

The intermediate space 4 is filled with a first insulating material 5 (see FIGS. 5 and 6), which forms what is known as the core. The first insulating material 5 is generally a dielectric material (a dielectric), which both lends the circuit carrier 1, 100 robustness and rigidity and, in its preliminary stage or in the raw state (not yet crosslinked or cured) can be deformed, at least in a thermoplastic manner. The first insulating material 5 may for example involve a thermoplastic, such as polyamide for example, or a thermosetting plastic, such as epoxy resin for example. In this context, a particularly advantageous material is a prepreg material, for example a glass-fiber reinforced prepreg material, in particular a glass-fiber reinforced laminate. At this point, it should be noted that many other materials may be used as the core for the circuit carrier 1, 100, provided they have a thermoplastic preliminary stage and can be cured after the shaping by means of heating, irradiation or by chemical reaction (for example by supplying heat) of at least two reactants.

Figure 2:
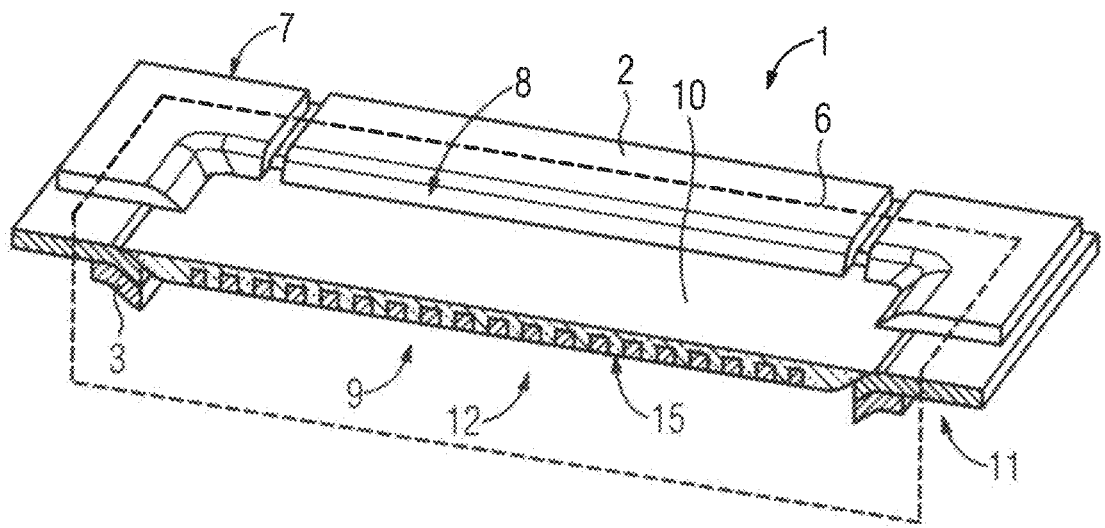
FIG. 2 shows a sectional representation of a top perspective view of the circuit carrier of FIG. 1.

Additionally, the circuit carrier 1, 100 has at least one region 6, 600 deformed in this way such that the electrically conductive layer 2 of the circuit carrier 1, 100 has an indentation 8 in the deformed region 6, 600. When viewed from above (e.g. FIG. 1 or FIG. 2), the indentation 8 may extend over the entire upper side 7 of the deformed region 6, 600. The shape of the indentation 8 may approximately correspond to the shape of a notch, which for example is rectangular and in particular is square. For example, as shown, it may have the shape of a trough with a trapezoid-shaped cross-section (FIG. 2). At this point, it should be noted that the deformed region does not only comprise the first (upper) side 7, but also the core 5 and preferably a second side 11 (the rear side) of the circuit carrier 1. The deformed region 6, 600 may have a spatial extent D and a depth h (see FIG. 10). The extent C may amount to approximately 0.5 to 5 cm, in particular 1.5 cm. For example, in a deformed region which is square-shaped when viewed from above (not shown), the extent D may be the same in both horizontal directions and may amount to 1.5 cm×1.5 cm for example. In preferred embodiments, the depth h may amount to approximately 200 to 300 micrometers. The flanks of the deformed regions 6, 600—i.e. the transitions between a non-deformed region of the electrically conductive layer 2 and the base of the indentation 8—descend towards the indentation base and may have an incline of approximately 20 to 30 degrees. It is indeed possible to implement a different incline angle α of the flank in relation to the non-deformed region of the electrically conductive layer 2. In the case of an angle which is too steep, e.g. 90 degrees, however, there would be the risk of a tear in the layer or film.

In this context, the second side 11 opposite the first side 7 (the rear side) of the circuit carrier 1 according to the first embodiment has an elevation 14 corresponding to, preferably congruent to the indentation 8. The second side 110 of the circuit carrier 100 is embodied in a flat manner according to the second embodiment.

Figure 3:
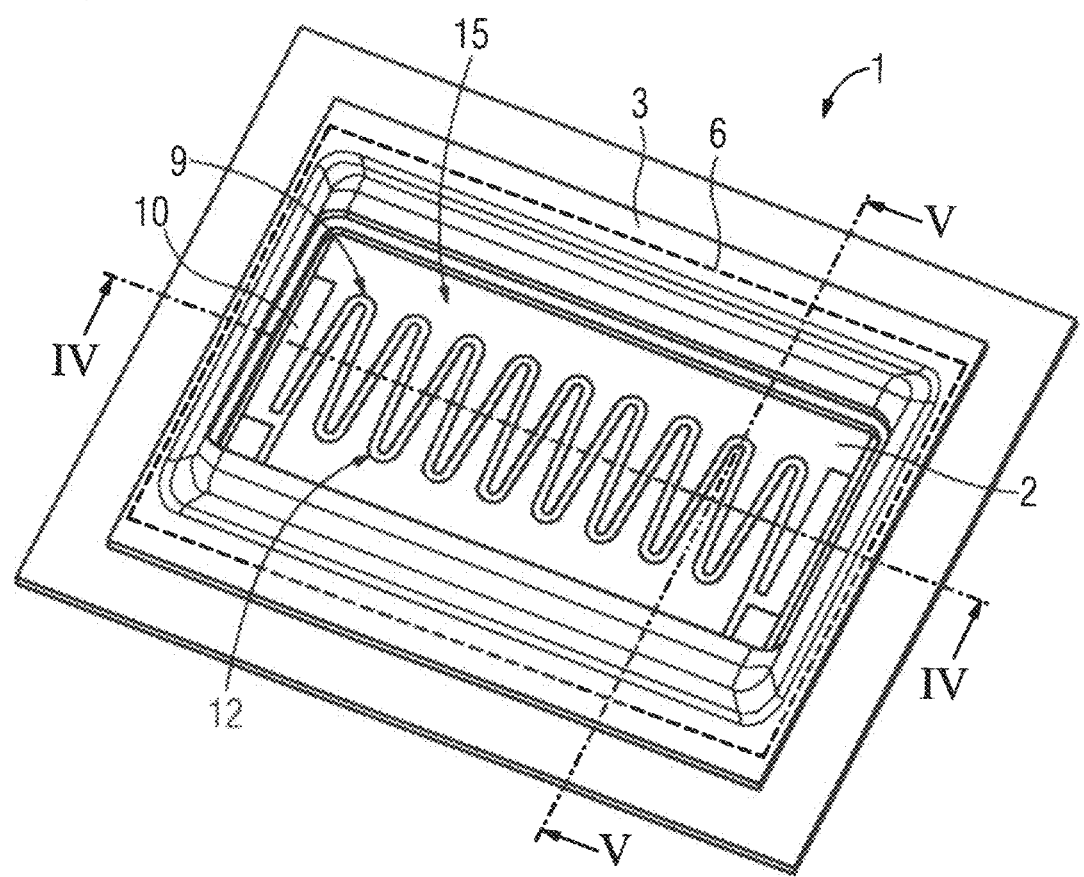
FIG. 3 shows a bottom perspective view of the circuit carrier of FIG. 1.

The first side 7 of the circuit carrier 1, 100 is structured at least in the indentation 8 and has a trace structure 9. The trace structure 9 is advantageously formed in the base of the indentation 8. The trace structure 9 may, for example, be generated by means of etching technology/subtractive methods or also by means of a laser, for example by means of a laser direct structuring. In FIGS. 3 to 5, it is particularly easy to identify that a through groove, i.e. in this context a groove passing through the second layer 2, can be introduced into the second layer 2 here. Depending on the application, the trace structure 9 may have various shapes. In the example shown, the through groove has the shape of a wave, for example a sinusoidal wave. The trace structure 9 advantageously corresponds to a mating contour (contour of the contact area) on a semiconductor die, with which the circuit carrier 1, 100 is to be populated and has the corresponding contacting points. The geometry of the trace structure generally depends upon the geometric contact areas of the terminals of the semiconductor die to be populated.

The indentation 8 is filled in with a second insulating material 10. Preferably, only the indentation 8 is filled in, so that there is no second insulating material 10 beyond the edges of the indentation 8 (see e.g. FIGS. 1 to 6). The application of the second insulating material 10 may already be possible at a room temperature (approx. 25° C.). It is also conceivable for the second insulating material 10 to be heated up and applied by way of dispensing, jetting or doctor blading. This depends upon the specific material selection.

The second insulating material 10 advantageously likewise involves a dielectric. Chemically curing materials, for example curable polymers with a liquid preliminary stage, in particular one or two-part epoxy resins, are particularly preferred here. It is also conceivable for physically bonding or thermoplastic substances to be used as the second insulating material 10. A prepreg material (prefabricated semi-finished part) may likewise function as second insulating material 10.

In the deformed region 6, 600, the second side 11, 110 (the rear side) of the circuit carrier 1, 100 has a cut-out 12 shaped in such a way that it is possible to populate a bare die 13 in the cut-out 12 and, in the process, bring said bare die 13 into electrical contact with the at least electrically conductive layer 2 attached to the first side 7 of the circuit carrier 1, 100 (see e.g. FIG. 5), In this context, the bare die 13 may be received in the cut-out 12 in such a way that an air gap remains between the bare die 13 and walls of the cut-out.

Figure 33:
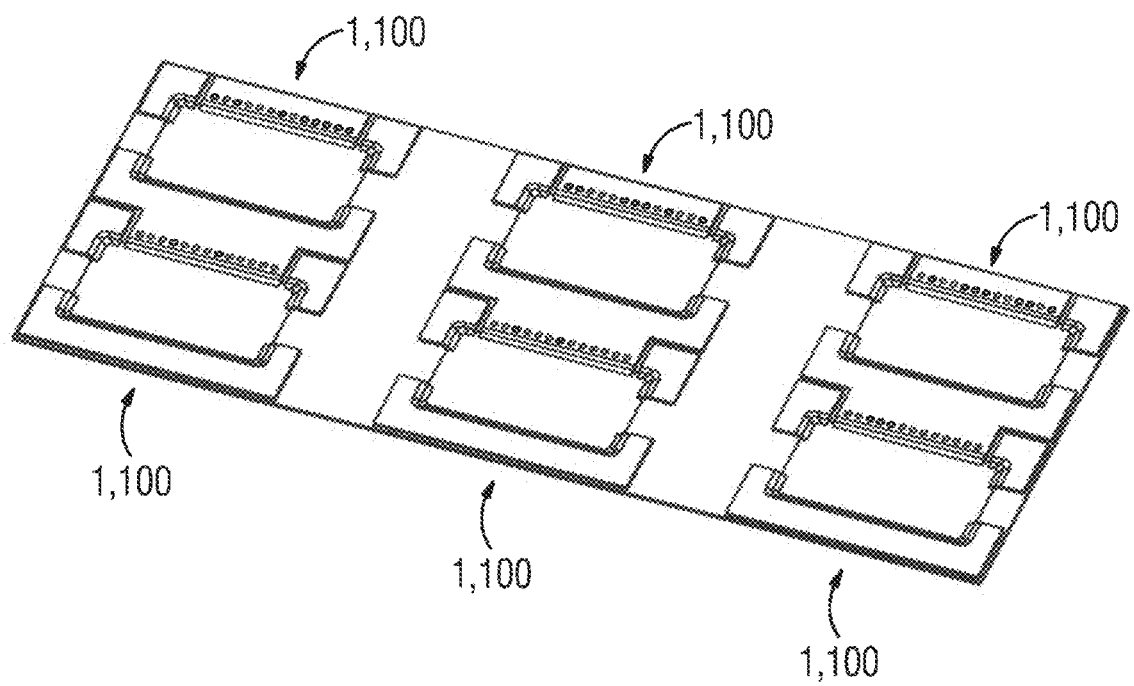
FIG. 33 shows a perspective view of a circuit carrier module with a plurality of circuit carriers according to the present invention.

It is understood that the circuit carrier 1, 100 may have a plurality of deformed regions 6, 600 and cut-outs 12 embodied as mentioned above and thus may be populated with a plurality of bare dies (see FIG. 33). In this context, one electronic component may be populated in each cut-out. It is possible to populate different kinds of electronic components in different cut-outs, such as lateral, e.g. GaN, or transverse, e.g. IGBT, components for example. In this case (FIG. 33), it may be expedient if the circuit carriers 1, 100 are connected to a half bridge in pairs.

The second layer 3 may be embodied from an at thermally conductive material. It is conceivable for the second layer to be embodied from the same material as the core of the circuit carrier 1, 100, i.e. from the first insulating material 5. Preferably, materials which are able to conduct both heat and current, so that it is both possible for the circuit carrier 1, 100 to be brought into (electrical) contact on both sides and also for the heat to be efficiently dissipated by way of the second layer 3. Metals, and in particular copper, lend themselves as such materials.

It is furthermore apparent from FIGS. 1 to 5 that the cut-out 12 may be formed in the elevation 14. In general, the cut-out is formed at the point of the rear side 11, 110 of the circuit carrier 1, 100 which lies opposite the indentation 8.

In FIGS. 3 to 6, it is particularly easy to identify that the cut-out 12 may be formed in such a deep manner that its base 15 is at least partially formed by the layer 2 which is made of the at least electrically conductive material and attached to the first side 7 of the circuit carrier 1, 100. This enables a particularly favorable bonding of the bare die 13 to the circuit carrier 1, 100.

FIGS. 7 to 18 show immediate products, which are produced after respective steps of a method, which for example may be used to manufacture the circuit carrier of FIGS. 1 to 5 described above.

Figure 7:
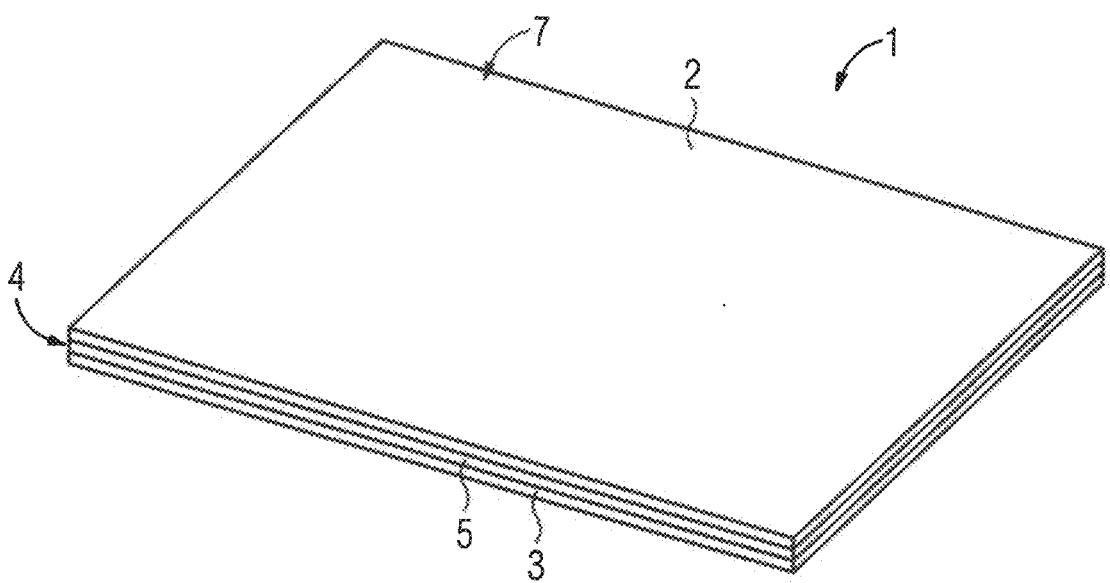
FIG. 7 shows a perspective view of a board with a first insulating material in a raw state.

The method comprises the following steps. In one step, a board is provided which e.g. is not yet laminated, wherein the board comprises two layers 2, 3 and at least one of the two layers 2, 3 of the board is made of the aforementioned at least electrically conductive material, such as copper for example. This electrically conductive layer 2 is arranged on a first side 7 of the board. Defined between the layers 2, 3 is the intermediate space 4, which is completely filled with the first insulating material 5. Boards of this kind are often referred to as base material. In this context, the first insulating material 5 is in its preliminary stage—material in the raw state. For example, the first insulating material 5 may have been applied to the first layer 2 in the form of a paste, A board of this kind is shown in FIG. 7, wherein it should be noted that the second layer 3 in principle may consist of the first insulating material 5. The (second) layer 3 may also be embodied from an electrically conductive material, e.g. from copper.

Figure 8:
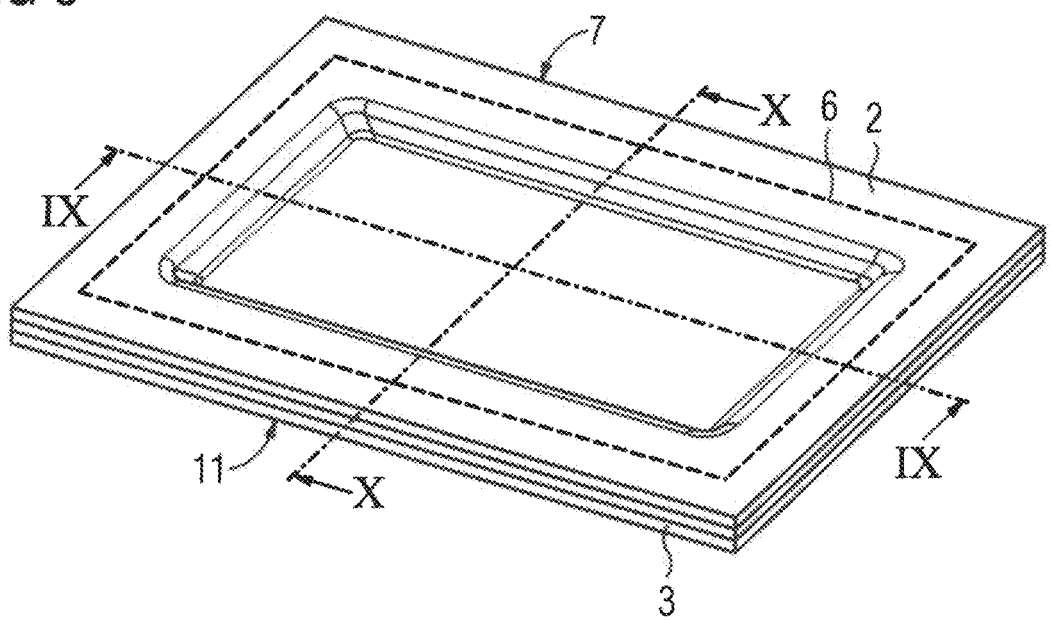
FIG. 8 shows a perspective view of a deformed board with the cured first insulating material.
Figure 9:
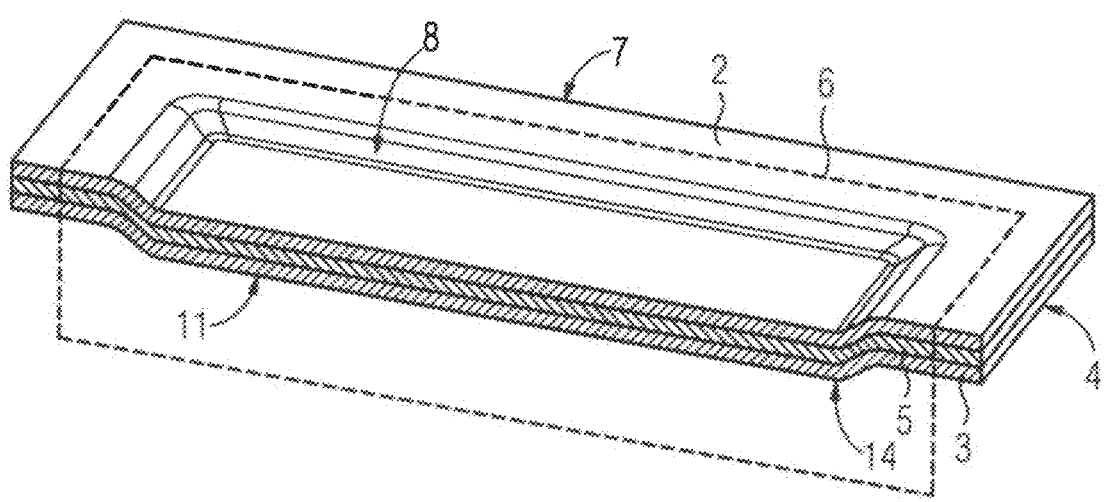
FIG. 9 shows a sectional representation of the board of FIG. 8.
Figure 10:
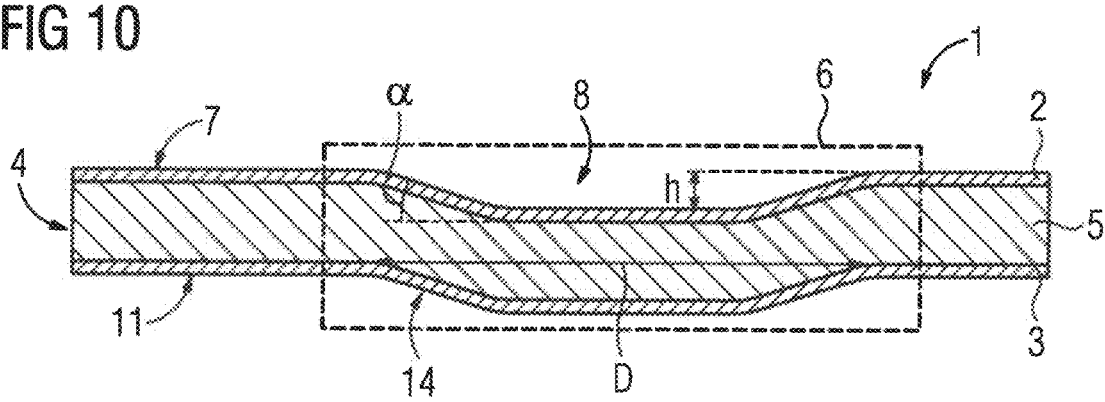
FIG. 10 shows a cross-sectional view of the board of FIG. 8.
Figure 11:
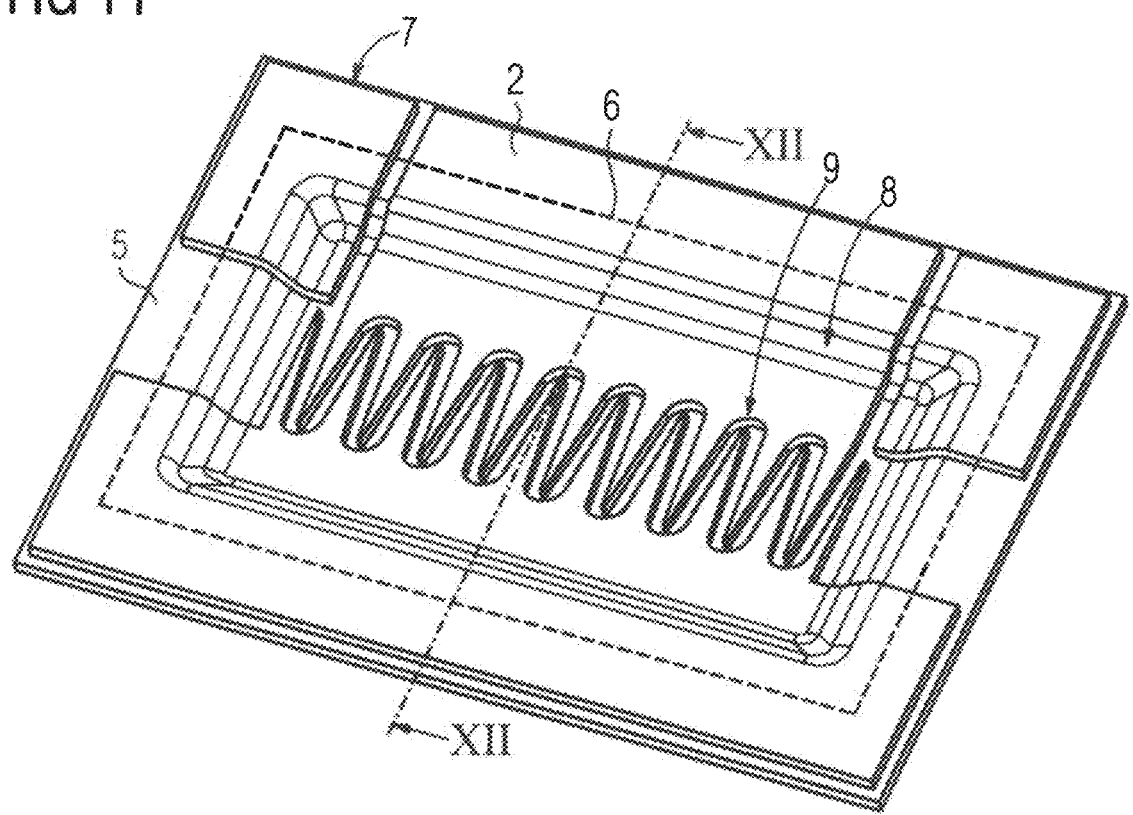
FIG. 11 shows a perspective view of the board of FIG. 8 with a trace structure.
Figure 12:
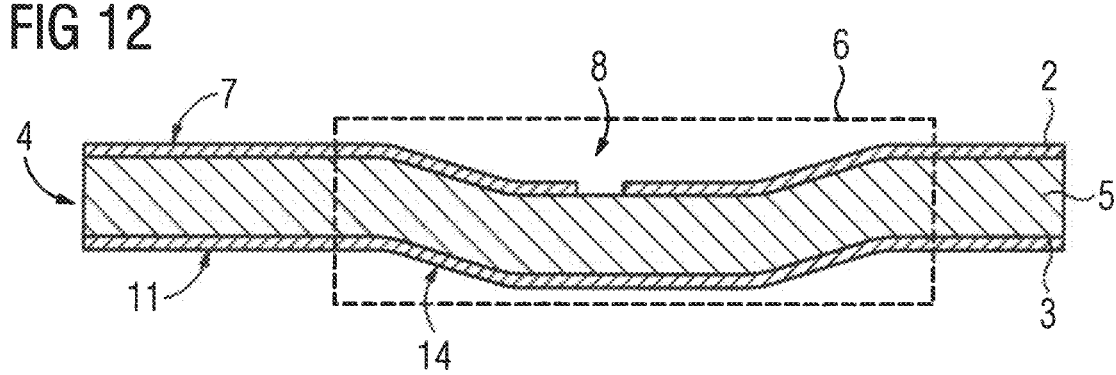
FIG. 12 shows a sectional representation of the board of FIG. 11.
Figure 13:
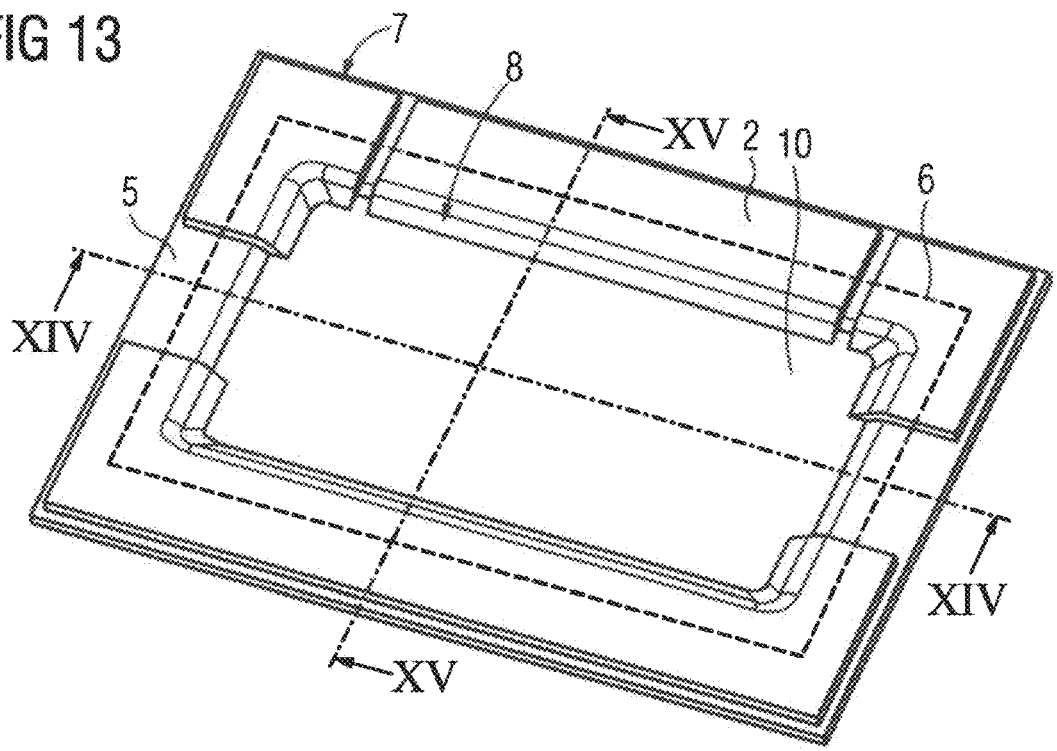
FIG. 13 shows a perspective view of the board of FIG. 11 with an indentation filled in with a second insulating material.
Figure 14:
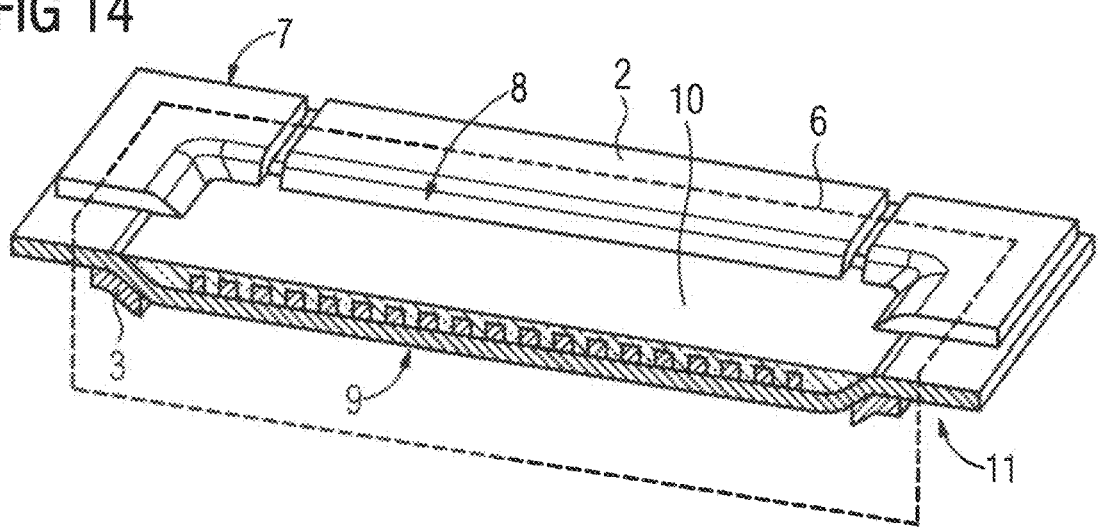
FIG. 14 shows a sectional representation of the board of FIG. 13.
Figure 15:
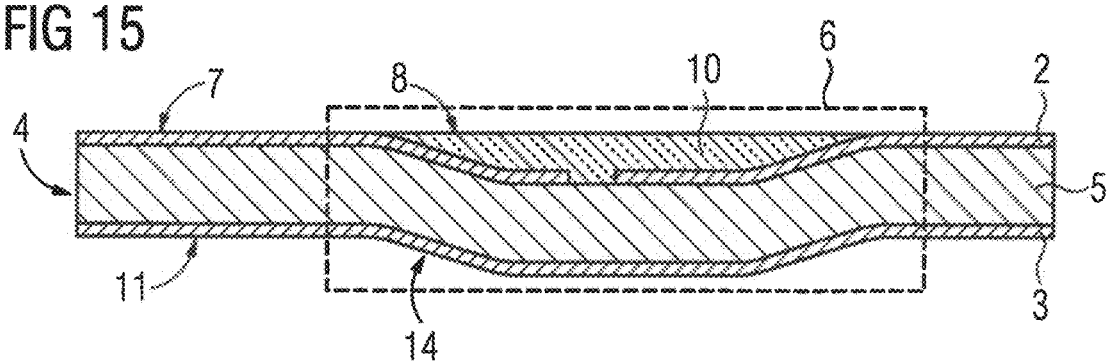
FIG. 15 shows a sectional representation of the board of FIG. 13.
Figure 16:
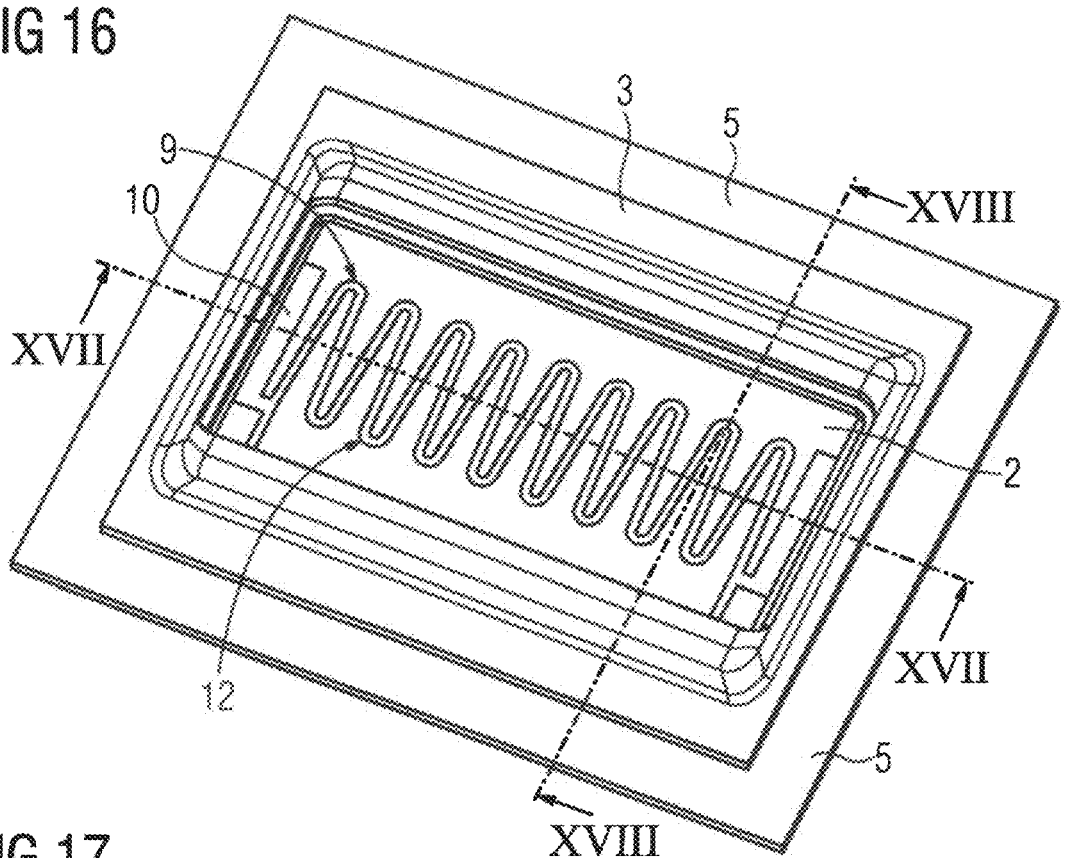
FIG. 16 shows a perspective view of the board from FIG. 13 with a cut-out on a rear side of the circuit carrier.
Figure 17:
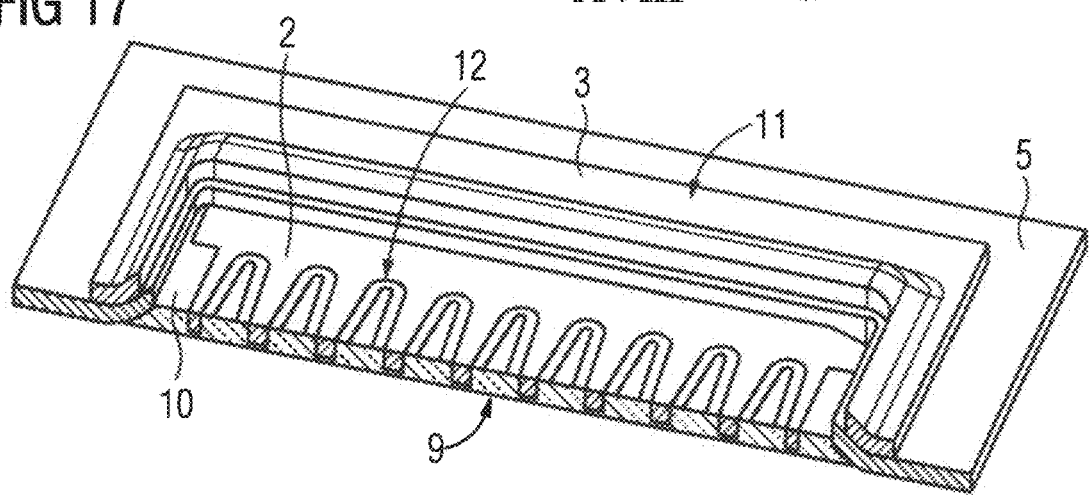
FIG. 17 shows a sectional representation of the circuit carrier of FIG. 16.
Figure 18:
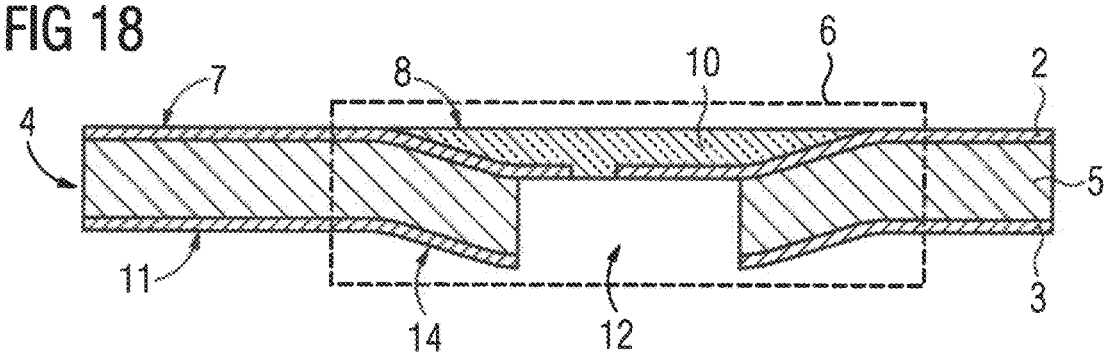
FIG. 18 shows a cross-sectional view of the circuit carrier of FIG. 16.

In another step (step A), the board is cured and in the process at least one region 6 of the board is deformed in such a way that the at least electrically conductive layer 2 has an indentation 8 in the deformed region 6 (FIGS. 8 to 10). This may take place by way of lamination. In this context, the at least one region 6 of the circuit carrier 1 may be deformed in such a way that the second side 11 of the circuit carrier 1 (the rear side) has an elevation 14 in the deformed region 6. For example, the desired regions of the board may already be deformed during the lamination of the base material made of two layers 2, 3 (e.g. made of copper) and the first insulating material 5 (e.g. prepreg material).

In another step (step B) the cutout 12 is formed on the second side 11 of the board opposite the first side 7 (on the rear side).

The temporal order of steps A and B can be chosen freely and, as already explained in the introduction to the description, substantially depends upon which material is used as the first insulating material. For example, the order B-A may be more suitable for glass-reinforced prepregs than the order A-B. In turn, the order A-B may be more suitable if the first insulating material 5 has the form of a viscous paste in the raw state.

Regardless of the order of steps A and B, the indentation 8 and the cut-out 12 are generated in the deformed region 6, 600 in such a way that they lie opposite one another and at least one electronic component, e.g. a bare die 13, can be populated in the cut-out 12 and brought into electrical contact with the at least electrically conductive layer 2 attached to the first side 7 of the circuit carrier 1—i.e. with the base of the indentation 8.

If the second side 11 has the aforementioned elevation 14, then the cut-out 12 is formed in the elevation 14, In this context, it may be expedient if the cut-out 12 is deep up to the layer 2 which is made of the at least electrically conductive material and attached to the first side 7 of the circuit carrier 1, so that for example bond pads (electrical terminals) 17 of the bare die 13 can be directly set onto the electrically conductive material of the at least one layer 2.

The generation of the cut-out 12 may for example take place by way of deep milling, in particular in the sequence A-B, or by punching out, in particular in the sequence B-A.

In order to obtain a trace structure 9, in one step of the method at least part of the at least electrically conductive layer 2 is structured. This working step may take place immediately after step A, whereby an intermediate product shown in FIGS. 11 and 12 may be obtained. In this case, the electrically conductive layer 2 is structured in the already present deformed region 6, specifically advantageously in a base of the indentation 8. Etching technology may be used in this context, for example.

It is also conceivable, however, for the structuring of the electrically conductive layer to still take place before step A and/or B. In such a case, the indentation 8 or the cut-out 12 is formed in the region of the board where the trace structure 9 is already present (the cut-out 12 is formed on a side of the board opposite the trace structure 9).

In another step, the indentation 8 may be filled in with the second insulating material 10, advantageously up to its edges. As a result, voltage flashovers between individual traces of the trace structure 9 may be avoided and leakage currents may be reduced.

Figure 19:
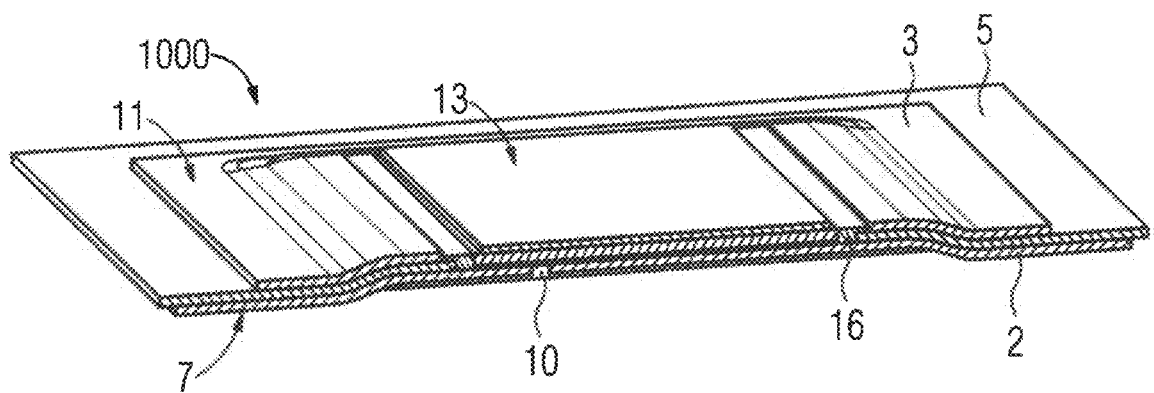
FIG. 19 shows a sectional representation of a package according to the present invention with a circuit carrier according to the present invention and with an insulating bare die.
Figure 20:
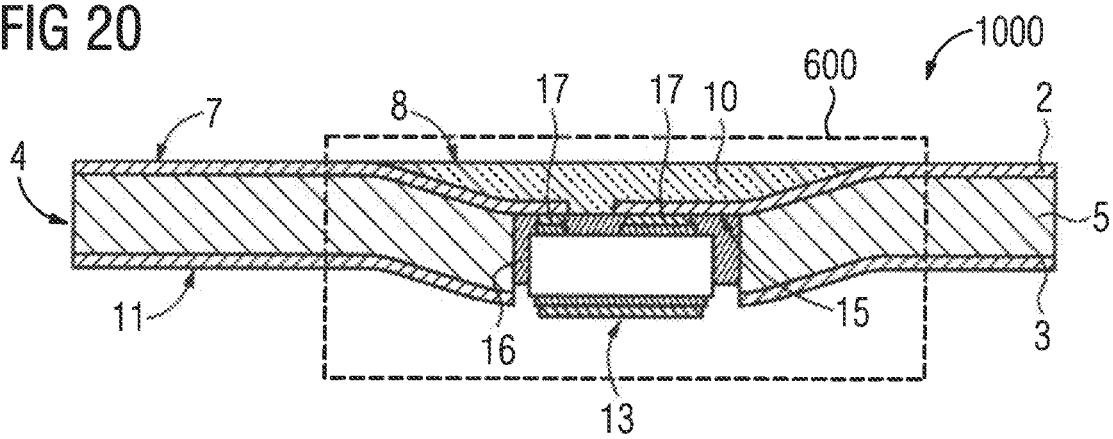
FIG. 20 shows a cross-sectional view of the package of FIG. 19.
Figure 21:
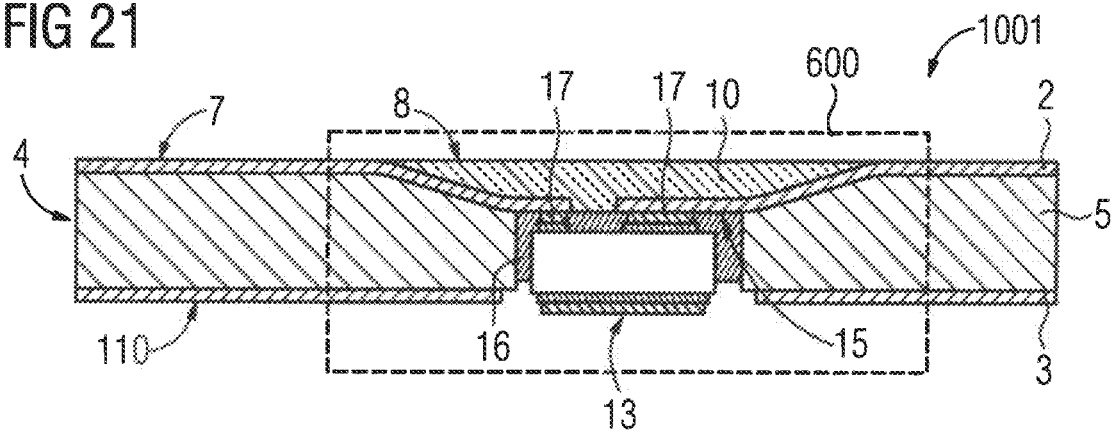
FIG. 21 shows a cross-sectional view of a package according to the present invention with the circuit carrier of FIG. 6 and with a bare die.

FIGS. 19 to 21 show packages which for example may be obtained with the aid of the circuit carriers 1, 100 described above. One such package 1000, 1001 for example comprises the circuit carrier 1 or 100 and at least one bare die 13, which is populated on the circuit carrier 1, 100.

The bare die 13 is thus arranged in the cut-out 12 and is electrically connected to the at least electrically conductive layer 2. To this end, the bare die 13 for example may have a plurality of the aforementioned electrical terminals 17, which are in contact with traces of the trace structure 9.

If necessary, the bare die 13 may be insulated by an optionally present air gap between the bare die 13 and both the walls and the part of the base of the cut-out 12, with which the bare die 13 is not in contact, being at least partially filled with a third insulating material 16. As a result, for example, the different terminals 17 (the bond pads) of the bare die 13 may be electrically insulated from one another. The third insulating material 16—a dielectric—is advantageously chosen from the same group of substances from which the first and the second insulating material are chosen.

It is conceivable for all three insulation materials to be different or the same. It is also conceivable for only the second insulating material 10 to be the same as the third insulating material 16.

As already explained, the bare die may be embodied as a lateral component, for example as a GaN component or a vertical component, for example as an IGBT component.

Figure 22:
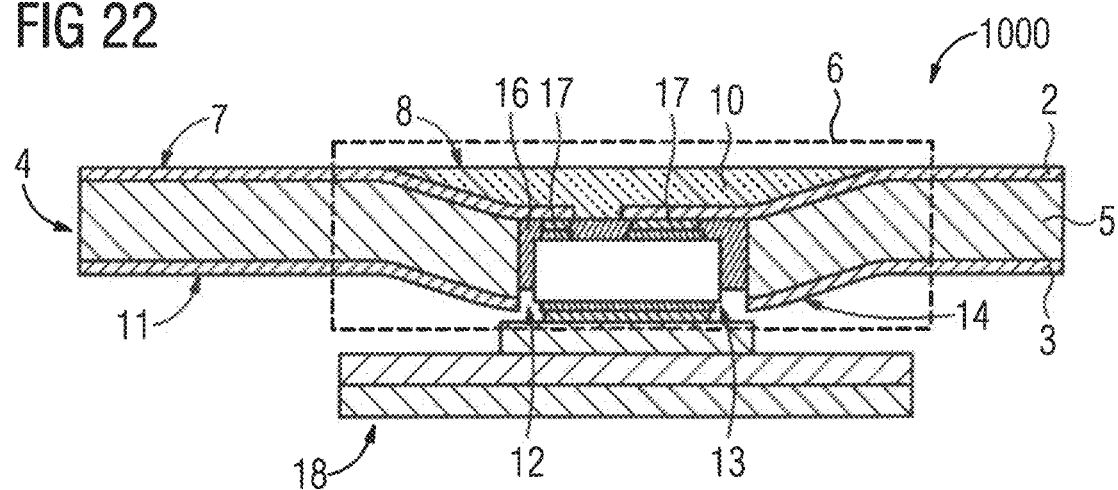
FIG. 22 shows a cross-sectional view of a package according to the present invention with an additional circuit carrier.
Figure 23:
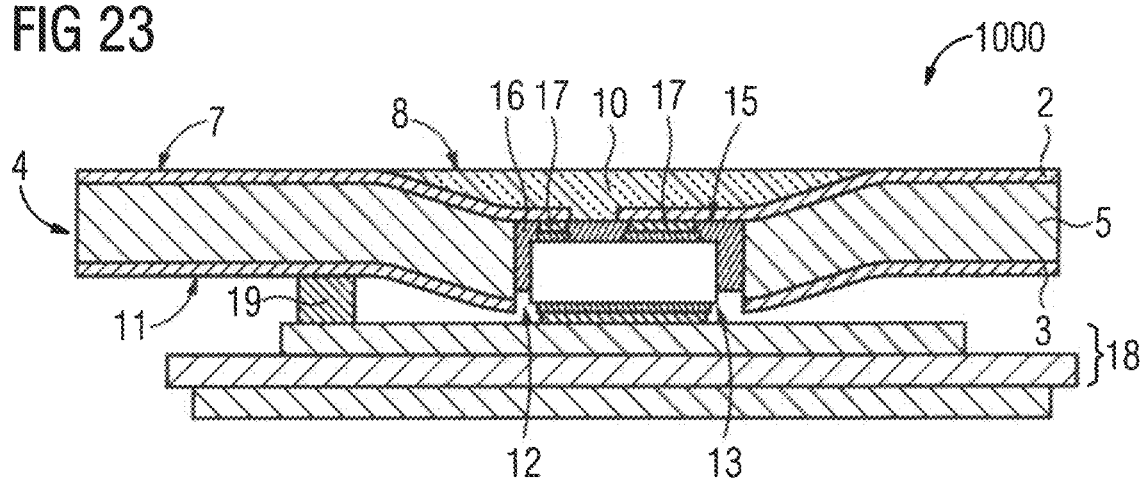
FIG. 23 shows a cross-sectional view of a modified package according to the present invention.
Figure 24:
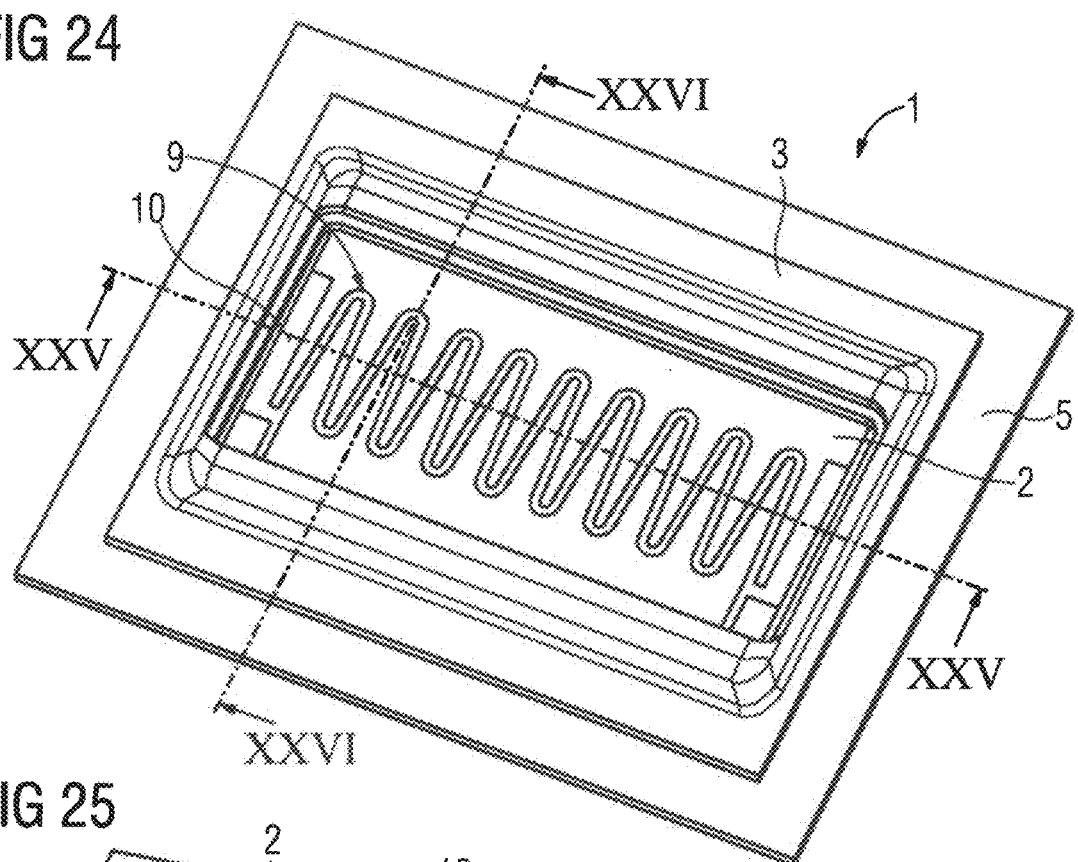
FIG. 24 shows a bottom perspective view of a circuit carrier according to the present invention to be populated.
Figure 25:
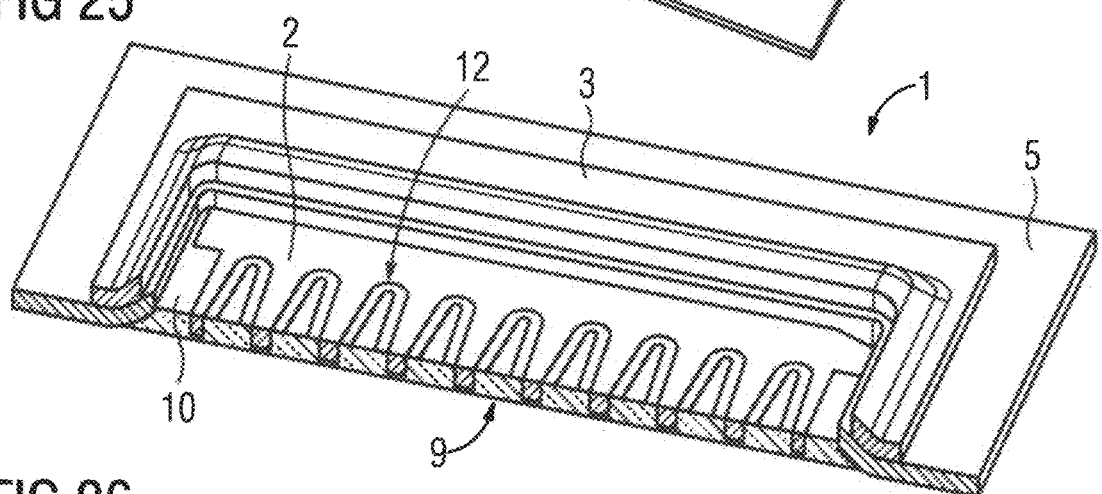
FIG. 25 shows a sectional representation of the circuit carrier of FIG. 24.
Figure 26:
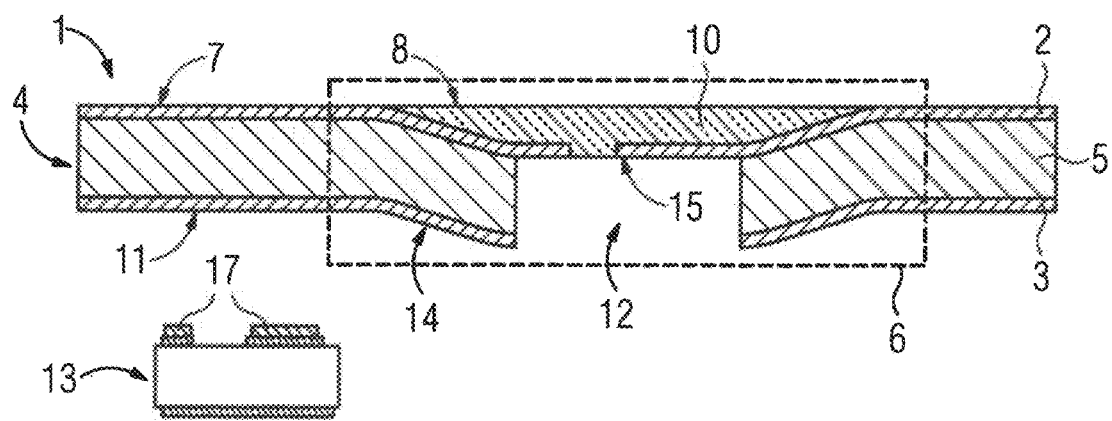
FIG. 26 shows a cross-sectional view of the circuit carrier of FIG. 24 with a bare die ready for population.
Figure 27:
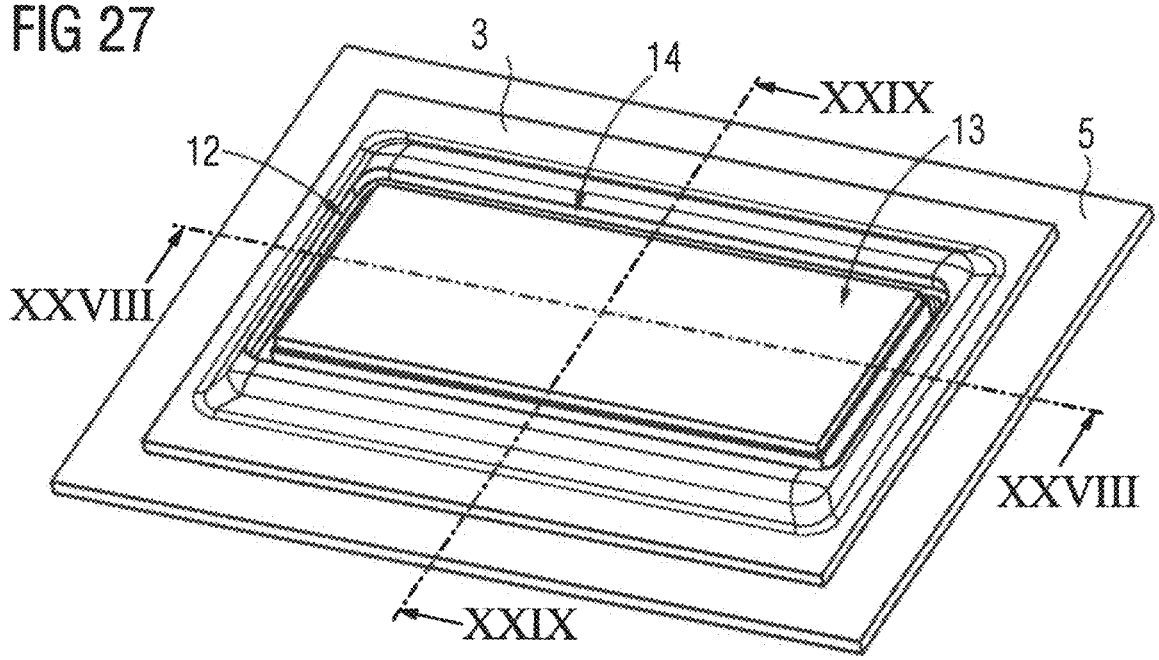
FIG. 27 shows a package according to the present invention with the circuit carrier of FIG. 24 populated with a non-insulated bare die.
Figure 28:
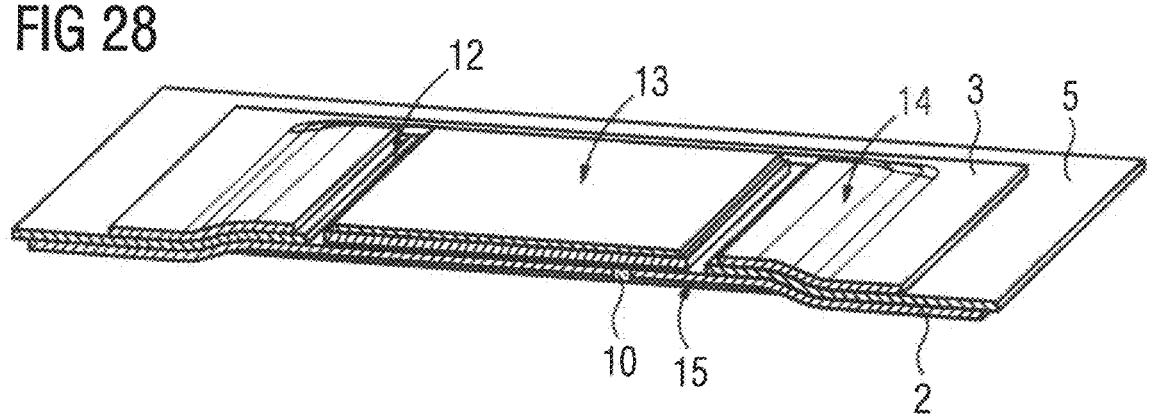
FIG. 28 shows a sectional representation of the package of FIG. 27.
Figure 29:
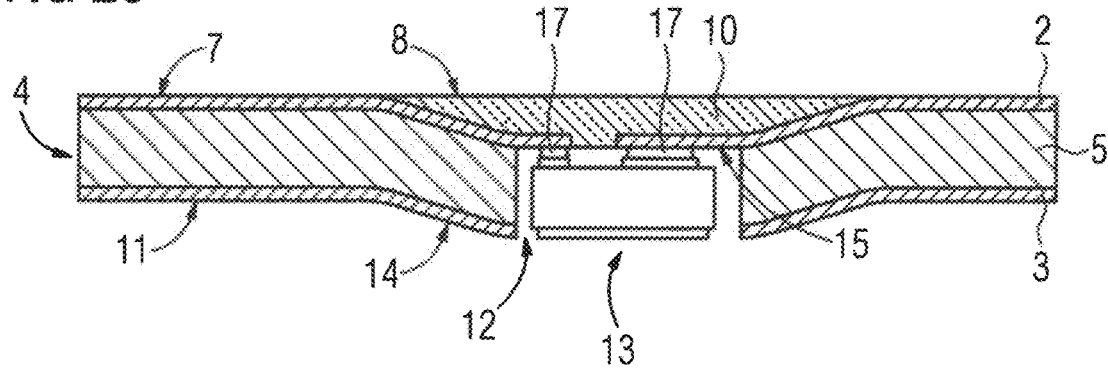
FIG. 29 shows a cross-sectional view of the package of FIG. 27.

Moreover, an additional circuit carrier 18 may be provided in the package 1000, 1001 (see FIGS. 22 and 23). This may be a ceramic circuit carrier, e.g. DCB (direct copper bonded) circuit carrier for example. The additional circuit carrier 18 may be attached to the side of the bare die 13 which lies opposite the first side 7 of the circuit carrier 1, 100 and—according to the examples shown in FIGS. 19 to 21—lies opposite the bond pads 17. The primary function of the additional circuit carrier 18 may be the thermal heat dissipation of the package 1000, 1001 for example. Moreover, the additional circuit carrier 18 may be used for the thermal insulation of the bare die 13. This makes it possible to obtain a package 1000 which can be brought into contact on one side, as can be seen in FIG. 22.

If the second layer 3 is electrically conductive, then the additional circuit carrier 18 may be electrically connected to the second layer 3 (for example by means of a pad 19 or bump or the like). In this case, the additional circuit carrier 18 dissipates the heat from the package 1000 and simultaneously ensures that the package 1000 can be brought into (electrical) contact on both sides (see FIG. 23).

Additionally, the layers 2 and 3 may be electrically connected (by way of a via through the insulating material 5). This is then particularly advantageous if a potential of a top-side pad is to be applied to the rear-side pad of the semiconductor die. Primarily in lateral components (GaN), it may be expedient if the source potential is applied to said pad, in order to reduce capacitive charge reversal losses in the die during switching. This, however, depends upon the semiconductor architecture/design and does not describe a generally applicable rule.

Figure 34:
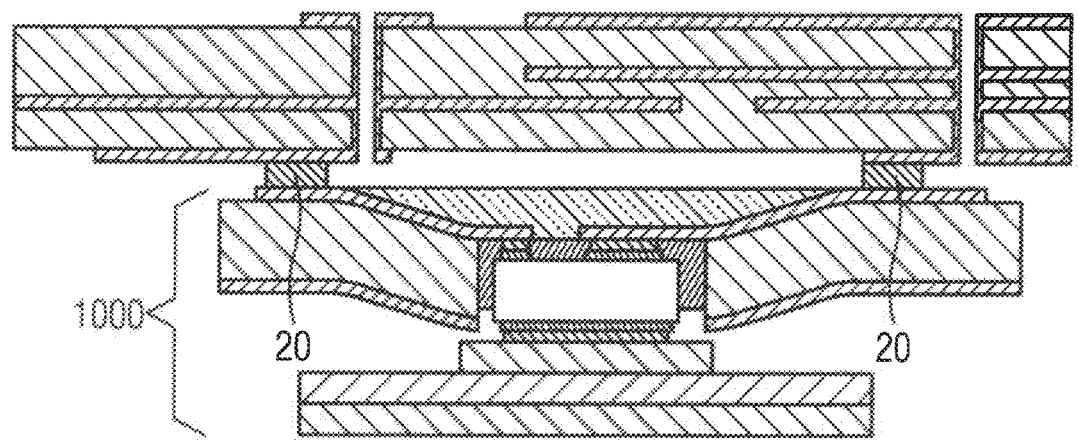
FIG. 34 shows a cross-sectional view of a package populated on a printed circuit board.

The package 1000, 1001 may be embodied as a surface-mounted component or as an SMD (surface-mounted device). FIG. 34 shows by way of example a printed circuit board populated with the package 1000. In this case, the package 1000 may be populated on a printed circuit board in a particularly simple manner, for example by means of further terminals 20 arranged on the at least one layer 2.

Figure 30:
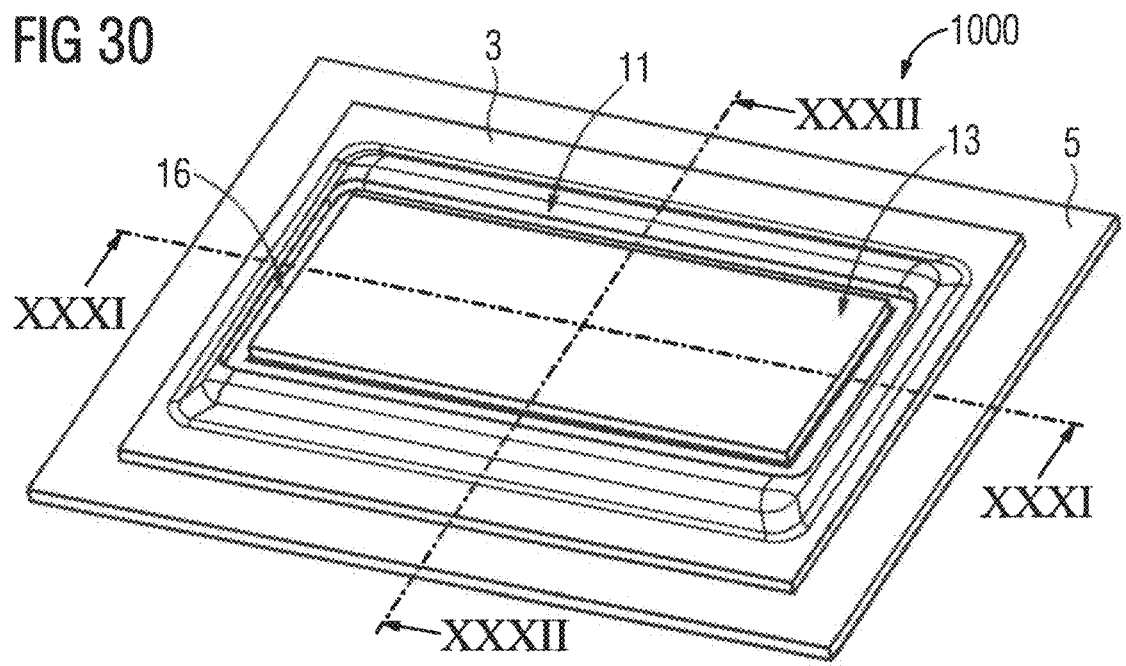
FIG. 30 shows a perspective view of the package of FIG. 27 with an insulated bare die.
Figure 31:
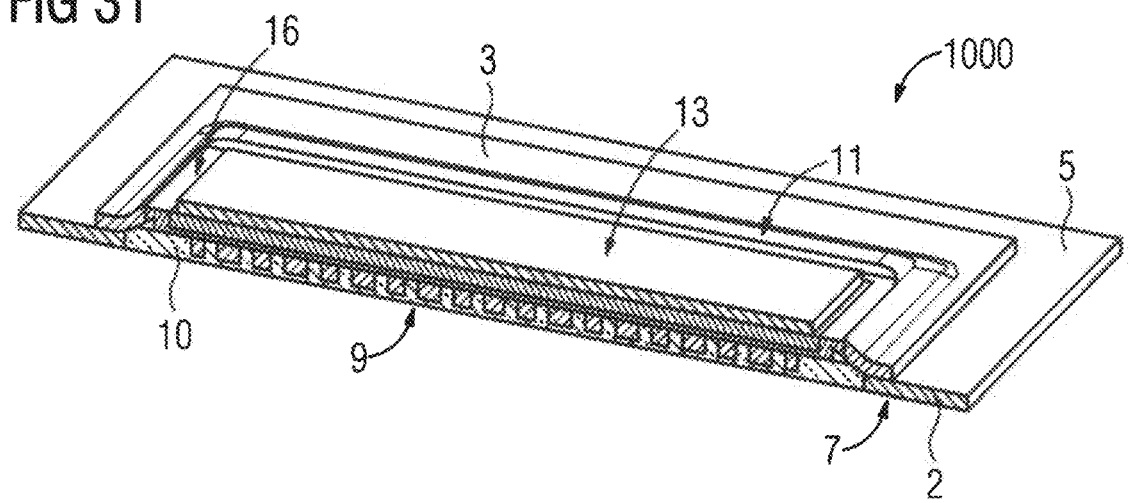
FIG. 31 shows a sectional representation of the package of FIG. 30.
Figure 32:
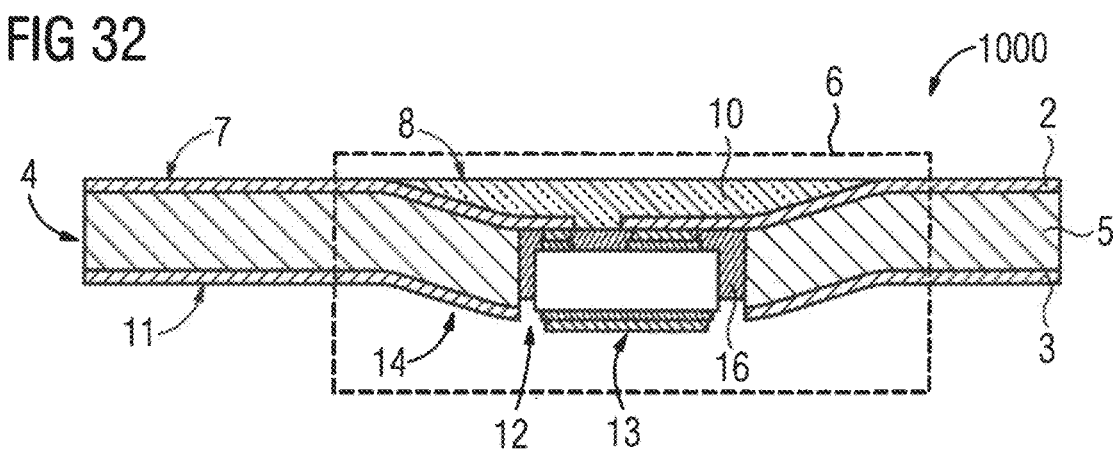
FIG. 32 shows a cross-sectional view of the package of FIG. 30.

In FIGS. 24 to 32, intermediate products of individual method steps of an exemplary method for manufacturing the package 1000 (e.g. according to FIG. 20) are shown. A circuit carrier 1, 100 and a bare die 13 can be assumed (see FIGS. 24 to 26). In this context, the circuit carrier 1, 100 may be obtained by the aforementioned circuit carrier manufacturing method for example. Subsequently, the bare die 13 may be populated in the cut-out 12 in such a way that the one bare die 13 is in electrical contact with the at least electrically conductive layer 2. Following this, the cut-out 12 may be at least partially filled with the third insulating material 16, so that the aforementioned air gap (FIGS. 27 to 29) between the bare die 13 and the areas delimiting the cut-out 12 is filled and terminals 17 of the bare die 13 can be insulated from one another (FIGS. 30 to 32).

Not shown in the Figures is the already explained preferred form of the package manufacturing method, in which the board in the raw state and an electronic component, e.g. a bare die, can be assumed. As already described, in this embodiment, first the cut-out can be formed, advantageously punched out, in the board provided. Following this, the bare die can be populated (and contacted) in the cut-out carved out of the semi-finished part made of the first insulating material, in order to obtain a populated board. Subsequently, the populated board can be cured and deformed in the process, advantageously by lamination, in order to obtain the at least one deformed region, in which the at least electrically conductive layer has the indentation at the point which lies opposite the indentation. In this context, during the curing and deforming, for example during the lamination using pressure and temperature, the heated first insulating material can flow into the intermediate spaces between the bare die and the at least electrically conductive layer and at least partially enclose and insulate the bare die. It is thus possible to dispense with the further insulation with a further insulating material (e.g. with a third insulating material). In this manner, the package 1001 from FIG. 21 can be generated for example.

FIG. 33 shows a circuit carrier 1, 100 with a plurality of deformed regions 6, 600, Circuit carriers 1, 100 of this kind enable module/cluster-like structures. The circuit carriers 1, 100 are connected to a half bridge in pairs.

It can be seen that alterations and/or additions of parts to the previously described circuit carrier, the package or manufacturing methods thereof may take place without deviating from the field and scope of the present invention. Likewise, it can be seen that although the invention has been described in relation to specific examples, a person skilled in the art would certainly be in a position to obtain many other corresponding forms of a circuit carrier, a package or manufacturing methods thereof, which have the properties presented in the claims and thus all fall within the protective scope specified thereby.

In summary, the invention relates to circuit carriers 1, 100 for receiving a bare die, wherein the circuit carrier 1, 100 comprises two layers 2, 3, wherein at least one of the two layers 2 of the circuit carrier 1, 100 is at least electrically conductive and is attached to a first side 7 of the circuit carrier 1, 100, wherein the layers 2, 3 define an intermediate space 4, which is completely filled with a first insulating material 5, wherein the circuit carrier 1, 100 has at least one region 6, 600 deformed in such a way that the at least electrically conductive layer 2 of the circuit carrier 1, 100 has an indentation 8 in the deformed region 6, 600, wherein the at least electrically conductive layer 2 of the circuit carrier 1, 100 has a trace structure 9 at least in the indentation 8, wherein the indentation 8 is filled in with a second insulating material 10, wherein a second side 11, 110 of the circuit carrier 1, 100 opposite the first side 7 has a cut-out 12 in the deformed region 6, 600 which is shaped in such a way that a bare die 13 can be populated in the cut-out 12 and, in doing so, can be brought into electrical contact with the at least electrically conductive layer 2 which is attached to the first side 7 of the circuit carrier 1, 100.

The reference characters in the claims merely serve to better understand the present invention and do not in any case signify a restriction of the present invention.

While the invention has been illustrated and described in connection with currently preferred embodiments shown and described in detail, it is not intended to be limited to the details shown since various modifications and structural changes may be made without departing in any way from the spirit and scope of the present invention. The embodiments were chosen and described in order to explain the principles of the invention and practical application to thereby enable a person skilled in the art to best utilize the invention and various embodiments with various modifications as are suited to the particular use contemplated.

What is claimed as new and desired to be protected by Letters Patent is set forth in the appended claims and includes equivalents of the elements recited therein:

1. A circuit carrier, comprising:
   a first side;
   two layers arranged to define an intermediate space there between, at least one of the two layers being electrically conductive and attached to the first side, said at least one of the two layers having a region deformed such as to exhibit an indentation, said at least one of the two layers having a trace structure in the indentation;
   a first insulating material filling the intermediate space;
   a second insulating material filling the indentation; and
   a second side in opposition to the first side and having in the deformed region a cut-out for receiving a bare die such as to come into an electrical contact with the at least one of the two layers.

2. The circuit carrier of claim 1, wherein the other one of the two layers is made of a thermally conductive material and/or is made of an electrically conductive material.

3. The circuit carrier of claim 1, wherein the first insulating material is a thermally deformable plastic.

4. The circuit carrier of claim 3, wherein the thermally deformable plastic is a prepreg material.

5. The circuit carrier of claim 4, wherein the prepreg material is a glass-fiber reinforced prepreg material.

6. The circuit carrier of claim 1, wherein the second insulating material is a resin or a prepreg material.

7. The circuit carrier of claim 1, wherein the cut-out in the second side has a base which is at least partially formed by the one of the two layers.

8. A package, comprising:
   a circuit carrier including a first side, two layers arranged to define an intermediate space there between, at least one of the two layers being electrically conductive and attached to the first side, said at least one of the two layers having a region deformed such as to exhibit an indentation, said at least one of the two layers having a trace structure in the indentation, a first insulating material filling the intermediate space, a second insulating material filling the indentation, and a second side in opposition to the first side and having in the deformed region a cut-out; and
   a bare die populated in the cut-out such as to come into an electrical contact with the at least one of the two layers.

9. The package of claim 8, further comprising a third insulating material at least partially filling the cut-out.

10. The package of claim 8, wherein the bare die includes a plurality of electrical terminals in contact with the trace structure.

11. The package of claim 8 further comprising an additional circuit carrier attached to the bare die at a side which faces away from the first side of the circuit carrier.

12. A converter, comprising:
   a circuit carrier including a first side, two layers arranged to define an intermediate space there between, at least one of the two layers being electrically conductive and attached to the first side, said at least one of the two layers having a region deformed such as to exhibit an indentation, said at least one of the two layers having a trace structure in the indentation, a first insulating material filling the intermediate space, a second insulating material filling the indentation, and a second side in opposition to the first side and having in the deformed region a cut-out for receiving a bare die such as to come into an electrical contact with the at least one of the two layers, and/or
   a package as set forth in claim 8.

* * * * *